United States Patent
Wei et al.

(10) Patent No.: US 8,094,482 B2
(45) Date of Patent: Jan. 10, 2012

(54) NONVOLATILE MEMORY APPARATUS AND NONVOLATILE DATA STORAGE MEDIUM

(75) Inventors: Zhiqiang Wei, Osaka (JP); Takeshi Takagi, Kyoto (JP); Ken Kawai, Osaka (JP); Kazuhiko Shimakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 147 days.

(21) Appl. No.: 12/529,466

(22) PCT Filed: Oct. 28, 2008

(86) PCT No.: PCT/JP2008/003055
§ 371 (c)(1),
(2), (4) Date: Sep. 1, 2009

(87) PCT Pub. No.: WO2009/057275
PCT Pub. Date: May 7, 2009

(65) Prior Publication Data
US 2010/0014343 A1    Jan. 21, 2010

(30) Foreign Application Priority Data
Oct. 29, 2007  (JP) ................................. 2007-279876

(51) Int. Cl.
*G11C 11/00* (2006.01)
(52) U.S. Cl. .............. 365/148; 365/189.16; 365/158
(58) Field of Classification Search .............. 365/148, 365/189.16, 158, 189.15
See application file for complete search history.

(56) References Cited

U.S. PATENT DOCUMENTS

| 3,852,796 | A | 12/1974 | Cuomo et al. |
| 7,133,310 | B2 * | 11/2006 | Hidaka ......................... 365/158 |
| 7,433,222 | B2 * | 10/2008 | Hosoi et al. .................. 365/148 |
| 7,796,426 | B2 * | 9/2010 | Tonomura et al. ............. 365/163 |

FOREIGN PATENT DOCUMENTS

| JP | 49-51881 | 5/1974 |
| JP | 2006-019444 | 1/2006 |
| JP | 2006-203178 | 8/2006 |
| JP | 2007-188603 | 7/2007 |
| JP | 2008-147343 | 6/2008 |
| WO | WO 2008/068800 A1 | 6/2008 |

OTHER PUBLICATIONS

H. Schroeder et al., "Resistive switching in a Pt/TiO2/Pt thin film stack-a candidate for a non-volatile ReRAM," Microelectric Engineering 2007, vol. 84, pp. 1982-1985.

* cited by examiner

*Primary Examiner* — David Lam
(74) *Attorney, Agent, or Firm* — McDermott Will & Emery LLP

(57) ABSTRACT

A nonvolatile memory apparatus and a nonvolatile data storage medium of the present invention, including nonvolatile memory elements each of which changes its resistance in response to electric pulses applied, comprises a first write circuit for performing first write in which a first electric pulse is applied to the nonvolatile memory element to switch a resistance value of the nonvolatile memory element from a first resistance value to a second resistance value and a second electric pulse which is opposite in polarity to the first electric pulse is applied to the nonvolatile memory element to switch the resistance value of the nonvolatile memory element from the second resistance value to the first resistance value.

20 Claims, 14 Drawing Sheets (a)

(b)

US 8,094,482 B2

NONVOLATILE MEMORY APPARATUS AND NONVOLATILE DATA STORAGE MEDIUM

RELATED APPLICATIONS

This application is the U.S. National Phase under 35 U.S.C. §371 of International Application No. PCT/JP2008/003055, filed on Oct. 28, 2008, which in turn claims the benefit of Japanese Application No. 2007-279876, filed on Oct. 29, 2007, the disclosures of which Applications are incorporated by reference herein.

TECHNICAL FIELD

The present invention relates to a nonvolatile memory apparatus and nonvolatile data storage medium for storing data using a material whose resistance value reversibly changes in response to electric pulses applied.

BACKGROUND ART

In advancement of digital technologies of electronic hardware in recent years, there has been an increasing demand for memory apparatuses having a larger capacity and nonvolatility, to preserve data of music, images, information, and so on. As one measure to meet the demand, a nonvolatile memory apparatus (hereinafter referred to as ReRAM) using a memory element including a resistance variable layer which changes its resistance value in response to electric pulses applied and maintains the changed state has attracted an attention. This is because the memory element can have a relatively simple structure, can be easily integrated to have a highly-dense structure, and is highly compatible with a conventional semiconductor process. In the ReRAM, it is required to develop a material capable of stably changing the resistance value with high reproducibility even when the memory element including the resistance variable layer is miniaturized, and a driving method thereof, and research and development for them has been vigorously made.

Patent document 1 discloses that a perovskite oxide is provided between a first electrode and a second electrode to form a resistance variable element, a voltage pulse with a fixed polarity is applied between the first electrode and the second electrode to cause electric resistance between the first electrode and the second electrode to change, and a change rate of the resistance value changes from positive to negative with an increase in a cumulated pulse application time associated with application of the voltage pulses. FIG. 12 is a view showing the relationship between the resistance value of the resistance variable material and a cumulated time of the voltage pulses applied which is disclosed in Patent document 1.

Non-patent document 1 discloses a method for permanently switching a resistance variable element using $TiO_2$ from bipolar resistance switching to unipolar resistance switching.

Patent document 1: Japanese Laid-Open Patent Application Publication No. 2006-19444

Non-patent document 1: Schroeder H. and Jeong D. S., 2007, Resistive switching in a Pt/TiO2/Pt thin film stack-a candidate for a non-volatile ReRAM, Microelectronic Engineering, vol. 84, pp. 1982-1985

DISCLOSURE OF THE INVENTION

Problems to be Solved by the Invention

The above described conventional ReRAM configuration has a problem that a retention time (retention characteristic) of the resistance value is short (about 100 hours at the longest). To improve the retention characteristic, there is a method in which data corresponding to "0" or "1" is written temporarily to the resistance variable element and thereafter the data is written thereto again to achieve a perfect write state. Such a two-step write process brings about a low write speed.

The present invention has been made to solve the above described problem, and an object of the present invention is to provide a nonvolatile memory apparatus and nonvolatile data storage medium which are capable of writing data at a high speed and of increasing a data retention time.

Means for Solving the Problem

The data retention characteristic may be possibly improved by switching to the unipolar resistance switching as disclosed in Non-patent document 1. However, in the configuration of Non-patent document 1, once the resistance variable element is switched to the unipolar resistance switching, it cannot return from the unipolar resistance switching to the bipolar resistance switching, so that the resistance variable element is unable to perform a high-speed operation again.

To achieve this object, a nonvolatile memory apparatus of the present invention uses a write operation having a high operation speed and using a pulse with an opposite polarity and a write operation having a good retention characteristic and using a pulse with an identical polarity and switches between the write operations, thus enabling the high-speed operation and the longer retention time.

As used herein, the phrase "writing having a high operation speed and using a pulse with an opposite polarity" refers to writing (bipolar writing) to a nonvolatile memory element (ReRAM element) in which an electric pulse (low-resistance state attaining pulse) applied to switch the element in a high-resistance state to a low-resistance state and an electric pulse (high-resistance state attaining pulse) applied to switch the element in the low-resistance state to the high-resistance state are different in polarity (bipolar state).

The low-resistance state attaining pulse and the high-resistance state attaining pulse which are applied in the bipolar writing are referred to as a bipolar low-resistance state attaining pulse and a bipolar high-resistance state attaining pulse, respectively. The high-resistance state and the low-resistance state of the nonvolatile memory element in the bipolar state are referred to as a bipolar high-resistance state and a bipolar low-resistance state, respectively.

As used herein, the phrase "writing having a good retention characteristic and using a pulse with an identical polarity" refers to writing (unipolar writing) to a nonvolatile memory element in which the low-resistance state attaining pulse and the high-resistance state attaining pulse are identical in polarity (unipolar state).

The low-resistance state attaining pulse and the high-resistance state attaining pulse which are applied in the unipolar writing are referred to as a unipolar low-resistance state attaining pulse and a unipolar high-resistance state attaining pulse, respectively. The high-resistance state and the low-resistance state of the nonvolatile memory element in the unipolar state are referred to as a unipolar high-resistance state and a unipolar low-resistance state, respectively.

The present inventors intensively studied repetitively to achieve the above object, and discovered that the element can be switched from the bipolar high-resistance state to the unipolar high-resistance state, by applying a third electric pulse (electric pulse having a polarity identical to that of the bipolar high-resistance state attaining pulse and having a larger voltage and a longer pulse width than the bipolar high-resistance state attaining pulse) to the nonvolatile memory element in the bipolar high-resistance state, and by further applying a fourth electric pulse (in example, electric pulse having a polarity identical to that of the third electric pulse, having a voltage which is equal in absolute value to voltages of the bipolar high-resistance state attaining pulse and the bipolar low-resistance state attaining pulse, and having a pulse width equal to those of the bipolar high-resistance state attaining pulse and the bipolar low-resistance state attaining pulse) which is identical in polarity to the third electric pulse to the nonvolatile memory element. With such a configuration, the nonvolatile memory element can be switched from the bipolar state to the unipolar state. The nonvolatile memory element in the unipolar high-resistance state is advantageous to data retention for a long time period, because it is capable of well retaining the resistance value (maintaining a high-resistance value for a longer time period). It should be noted that the element in the low-resistance state is capable of well retaining the resistance value, regardless of whether the element is in the bipolar low-resistance state or in the unipolar low-resistance state.

In addition, the present inventors discovered that the element can be switched from the unipolar high-resistance state to the bipolar low-resistance state by applying a fifth electric pulse which is different in polarity from the third electric pulse (in example, electric pulse which is different in polarity from the third electric pulse, has a voltage which is equal in absolute value to a voltage of the third electric pulse, and has a pulse width equal to that of the third electric pulse) to the nonvolatile memory element in the unipolar high-resistance state. With such a configuration, the nonvolatile memory element can be switched from the unipolar state to the bipolar state. The nonvolatile memory element in the bipolar state is advantageous to high-speed writing because the pulse width of the write pulse is short. After the element has been switched from the unipolar high-resistance state to the bipolar low-resistance state, it is switched to the bipolar high-resistance state by applying the bipolar high-resistance state attaining pulse.

The fact that the nonvolatile memory element (ReRAM element) can be switched from the unipolar state to the bipolar state has been unknown so far, and was discovered first by the present inventors.

As a mechanism for switching the state of the nonvolatile memory element between the bipolar state and the unipolar state as desired in the manner described above, the following may be considered.

To be specific, the resistance value of the nonvolatile memory element in the bipolar state was analyzed and as a result, it was revealed that the resistance state switches in an extremely thin region of an interface between the electrode and the resistance variable layer at a positive electrode side in the case of applying the bipolar high-resistance state attaining pulse (negative electrode side in the case of applying the bipolar low-resistance state attaining pulse). It was found that as a result of Raman scattering analysis, $\gamma$-$Fe_2O_3$ layer was formed on the resistance variable layer side of the electrode interface. The result is disclosed in Odagawa A. et al., 2007, Electroforming and resistance-switching mechanism in a magnetite thin film, Applied Physics Letters vol. 91, 133503.

From the above results, it was presumed that the mechanism for switching the resistance state of the nonvolatile memory element in the bipolar state is oxidation and reduction reactions which occur between $Fe_3O_4$ and $\gamma$-$Fe_2O_3$ at the electrode interface. When an electric pulse is applied in a polarity (polarity in which a current flows from the electrode to the resistance variable layer) in which electrons flow into the electrode, the resistance variable layer in the vicinity of the electrode interface is oxidized, and the resistance value increases (high-resistance state is attained). When an electric pulse with an opposite polarity is applied, the resistance variable layer in the vicinity of the electrode interface is reduced and the resistance value is reduced (low-resistance state is attained).

Meanwhile, the present inventors researched temperature dependency of the resistance value of the nonvolatile memory element. FIG. 13 is a view showing the temperature dependency of the resistance value of the resistance variable element in the bipolar state and the temperature dependency of the resistance value of the resistance variable element in the unipolar state. In experiment, used was a resistance variable element (electrode area: 0.25 $\mu m^2$, thickness of the resistance variable layer: 100 nm, a producing method of resistance variable layer:sputtering) using platinum (Pt) as a material of the upper electrode and the lower electrode and using $Fe_2O_3$/$Fe_3O_4$ as a resistance variable material. As shown in FIG. 13, in the element in the bipolar high-resistance state and in the element in the bipolar low-resistance state, the resistance value decreased with an increase in temperature. That is, the elements showed a semiconductor-like characteristic. It was. found that the element in the unipolar high-resistance state shows the semiconductor-like characteristic in a similar manner but the element in the unipolar low-resistance state increases the resistance value with an increase in the temperature. That is, it was found that the element in the unipolar low-resistance state shows a metal-like characteristic.

From the above results, it was presumed that the mechanism for switching the resistance state of the nonvolatile memory element in the unipolar state is due to an event that a filament path is formed between the electrodes. Switching of the resistance value occurs by an event that the filament path is disconnected or connected by applying the voltage.

When the voltage which is identical in polarity to the bipolar high-resistance state attaining pulse is applied (preferably, the voltage having a larger absolute value is applied for a longer time period, for example, the unipolar low-resistance state attaining pulse is applied) to the element in the bipolar high-resistance state, the layer of high-resistance value $\gamma$-$Fe_2O_3$ increases in thickness, finally forming the filament path because of occurrence of soft breakdown. Thereby, the element is switched to the unipolar low-resistance state. By further applying the voltage having an identical polarity (e.g., applying the bipolar high-resistance state attaining pulse or the unipolar high-resistance state attaining pulse), the element is switched to the unipolar high-resistance state. This is "second write" (unipolar switching)."

When the voltage which is identical in polarity to the bipolar low-resistance state attaining pulse is applied (preferably, the voltage having a larger absolute value is applied for a longer time period, for example, a pulse which is opposite in polarity to the unipolar low-resistance state attaining pulse, has a voltage equal in absolute value to a voltage of the unipolar low-resistance state attaining pulse, and has a pulse width equal to that of the unipolar low-resistance state attaining pulse is applied) to the element in the unipolar high-resistance state, the $\gamma$-$Fe_2O_3$ layer is reduced and made thinner, and $Fe_3O_4$ increases, enabling the element to be switched to the bipolar low-resistance state. This is "write switching" (bipolar switching).

To be specific, to solve the above described problem, a nonvolatile memory apparatus of the present invention, including nonvolatile memory elements each of which has a bipolar state and a unipolar state and changes resistance in response to electric pulses applied, comprises a second write circuit for sequentially applying two electric pulses which are identical in polarity to a nonvolatile memory element in a bipolar high-resistance state to switch the nonvolatile memory element in the bipolar high-resistance state to a unipolar high-resistance state; and a write switching circuit for applying a write switching pulse which is opposite in polarity to the two electric pulses to the nonvolatile element in the unipolar high-resistance state to switch the nonvolatile memory element in the unipolar high-resistance state to a bipolar low-resistance state.

In such a configuration, the same nonvolatile memory apparatus is capable of a high-speed operation by bipolar write and of retaining a high-resistance state for a long time period by unipolar write. Therefore, it is possible to provide a nonvolatile memory apparatus and nonvolatile data storage medium which are capable of writing data at a high speed and of increasing a data retention time.

To be specific, to solve the above described problem, a nonvolatile memory apparatus of the present invention including nonvolatile memory elements each of which changes its resistance in response to electric pulses applied, comprises a first write circuit for performing first write in which a first electric pulse is applied to the nonvolatile memory element to switch a resistance value of the nonvolatile memory element from a first resistance value to a second resistance value and a second electric pulse which is opposite in polarity to the first electric pulse is applied to the nonvolatile memory element to switch the resistance value of the nonvolatile memory element from the second resistance value to the first resistance value; a second write circuit for performing second write in which a third electric pulse is applied to the nonvolatile memory element to switch the resistance value of the nonvolatile memory element from a third resistance value to a fourth resistance value and a fourth electric pulse which is identical in polarity to the third electric pulse is applied to the nonvolatile memory element to switch the resistance value of the nonvolatile memory element from the fourth resistance value to a fifth resistance value; a write switching circuit for generating a write switching pulse to switch the resistance value of the nonvolatile memory element from the fifth resistance value to the first resistance value; and a controller configured to execute control to select the first write circuit, the second write circuit, or the write switching circuit; wherein the nonvolatile memory apparatus is configured to perform the first write or the second write to the nonvolatile memory element using the circuit selected by the controller.

The write switching circuit may be configured to apply a fifth electric pulse which is opposite in polarity to the fourth electric pulse before the first write circuit writes data and then the first write circuit may write data.

In such a configuration, the nonvolatile memory apparatus is able to attain a high-speed operation and long-time data retention.

It is preferable that in the nonvolatile memory apparatus, the first electric pulse is identical in polarity to the third electric pulse.

In the above configuration, the first electric pulse is an electric pulse having a voltage equal to a voltage of the fourth electric pulse, and the first electric pulse has a pulse width equal to a pulse width of the fourth electric pulse. With this setting, the kinds of pulses can be reduced, a circuit area can be reduced, and an apparatus configuration can be simplified.

It is preferable that in the above nonvolatile memory apparatus, the third electric pulse has a voltage which is larger in absolute value than a voltage of the fourth electric pulse. Also, the third electric pulse is set to have a pulse width which is not smaller than a pulse width of the fourth electric pulse, thereby improving the retention characteristic of the nonvolatile memory apparatus.

The third resistance value is equal to the second resistance value.

The first resistance value is a first low-resistance value, and the second resistance value is a first high-resistance value having a resistance value higher than a resistance value of the first low-resistance value. The third resistance value is a first high-resistance value, and the fourth resistance value is a second low-resistance value having a resistance value lower than a resistance value of the first low-resistance value. The fifth resistance value is a second high-resistance value having a resistance value higher than a resistance value of the first high-resistance value.

In a nonvolatile memory apparatus of the present invention, the controller includes a first controller and a second controller, wherein the first controller is configured to read data from a nonvolatile memory element to which the first write circuit has written data, and to cause the second write circuit to write data when detecting the first resistance value; and the second controller is configured to read data from a nonvolatile memory element to which the second write circuit has written the data, and causes the first write circuit to write data when detecting the third resistance value.

In such a configuration, how to write data can be easily determined based on the read value.

In the above nonvolatile memory apparatus, the write switching circuit may be configured to apply a fifth electric pulse which is opposite in polarity to the fourth electric pulse before the first write circuit performs a write operation and then the first write circuit performs the write operation. Thereby, the second write operation can be switched to the first write operation.

In such a configuration, the resistance variable data storage medium is attainable as a nonvolatile data storage medium which has a high speed and has a long data retention time.

The nonvolatile memory apparatus may further comprise a memory cell array including plural memory cell sections each including plural memory cells respectively having the nonvolatile memory elements; and a temporary write flag region including flag nonvolatile memory elements respectively provided for the memory cell sections such that one flag nonvolatile memory element corresponds to one memory cell section, wherein in the temporary write flag region, a first write state is written to a flag nonvolatile memory element so as to correspond to the first write performed by the first write circuit to a nonvolatile memory element belonging to a memory cell section, and a second write state is written to a flag nonvolatile memory element so as to correspond to the second write performed by the second write circuit to a nonvolatile memory element belonging to a memory cell section.

A nonvolatile data storage medium comprises the nonvolatile memory apparatus; and a fourth controller; wherein the fourth controller may be configured to, based on a value of the temporary write flag region, determine whether or not each of the memory cell sections is a write target memory cell section to which the second write circuit writes data, the write target memory cell section including a nonvolatile memory element to which the second write circuit has not completed writing of the data; and the fourth controller may be configured to cause the second write circuit to write data to a nonvolatile memory element belonging to the write operation target memory cell section to which the second write circuit writes data.

In such a configuration, it can be easily determined whether or not each memory cell section has a memory cell to which the second write circuit has not completed the write operation, based on the value of the temporary write flag region. Therefore, it can be easily determined whether or not the second write circuit needs to write data to the memory section.

The nonvolatile memory apparatus may further comprise a switching sequence control circuit configured to control the write switching circuit so as to switch between the first write circuit and the second write circuit; wherein the switching sequence control circuit may be configured to execute control to cause the second write circuit to write data when a control signal input from an external device indicates that the nonvolatile memory apparatus is not selected.

In such a configuration, when data input from the external device is stopped, the second write circuit writes data autonomously. Therefore, the control using the external controller is executed in a simple manner, and convenience of the user (e.g., manufacturer for manufacturing a system using the nonvolatile memory apparatus) is improved.

A nonvolatile data storage medium of the present invention comprises the nonvolatile memory apparatus and a fifth controller, and the fifth controller is the external device.

In such a configuration, when data input from the external device is stopped, the second write circuit writes data autonomously. Therefore, it is possible to attain a data storage medium which is capable of simplifying control using the external controller, and of writing data using the second write circuit.

In the nonvolatile memory apparatus, the switching sequence controller may be configured to control the write switching circuit to cause the second write circuit to perform the write operation when an electric power supply is performing a TURN-OFF operation.

In such a configuration, the second write circuit has completed writing of data to all the memory cells containing data when the electric power supply is OFF. Therefore, the data can be surely preserved during an OFF-state of the electric power supply.

In the nonvolatile memory apparatus, the switching sequence controller is configured to control the write switching device to cause the first write circuit to write data when an electric power supply is performing a TURN-ON operation.

In such a configuration, the write switching device performs a switching operation to cause the first write circuit to write data to attain a high-speed operation when the electric power supply is ON and does not perform the switching operation in a normal operation. As a result, overall system performance is not substantially affected by the switching operation.

The nonvolatile memory apparatus is configured to output a flag signal indicating that the second write is being performed to inhibit that the external device inputs write data to the nonvolatile memory apparatus, when the second write circuit is writing data.

In such a configuration, when the second write circuit is writing data, the external controller or the like can easily determine that the second write circuit is writing data. This makes it possible to prevent an incorrect operation.

A method for operating a nonvolatile memory apparatus of the present invention, including nonvolatile memory elements each of which has a bipolar state and a unipolar state and changes resistance in response to electric pulses applied, comprises a second write step for performing second write in which two electric pulses which are identical in polarity are sequentially applied to a nonvolatile memory element in a bipolar high-resistance state to switch the nonvolatile memory element in the bipolar high-resistance state to a unipolar high-resistance state; and a write switching step for performing write switching in which a write switching pulse which is opposite in polarity to the two electric pulses is applied to the nonvolatile element in the unipolar high-resistance state to switch the nonvolatile memory element in the unipolar high-resistance state to a bipolar low-resistance state.

In such a configuration, the same nonvolatile memory apparatus is capable of the high-speed operation by the bipolar write and of retaining the high-resistance state for a long time period by the unipolar write. Therefore, it is possible to provide a nonvolatile memory apparatus and nonvolatile data storage medium which are capable of writing data at a high speed and of increasing a data retention time.

The above and further objects, features and advantages of the present invention will more fully be apparent from the following detailed description of preferred embodiments with accompanying drawings.

EFFECT OF THE INVENTION

With the above described configuration, the present invention can provide a nonvolatile memory apparatus and nonvolatile data storage medium which are capable of normal operation at a high speed, of attaining a good retention characteristic, and of performing a switching operation in a simple manner.

BRIEF DESCRIPTION OF THE DRAWINGS

FIG. 1 is a block diagram showing a schematic configuration of a nonvolatile memory apparatus according to Embodiment 1 of the present invention.

FIG. 2 is a block diagram showing a schematic configuration of a nonvolatile data storage medium system according to Embodiment 1 of the present invention.

FIG. 3 is an equivalent circuit diagram showing a schematic configuration of a memory cell array according to Embodiment 1 of the present invention.

FIG. 4 is a schematic diagram of a configuration of a circuit for writing and reading data to and from a memory cell according to Embodiment 1 of the present invention.

FIG. 5 is a graph showing a change in a resistance value which occurs when an electric pulse is applied to a resistance variable element of FIG. 3.

FIG. 7 is a flowchart schematically showing the first write operation according to Embodiment 1 of the present invention.

FIG. 8 is a flowchart schematically showing the second write operation according to Embodiment 1 of the present invention.

FIG. 9 is a flowchart schematically showing an operation for switching from second write to first write according to Embodiment 1 of the present invention.

FIG. 10 is a block diagram showing a schematic configuration of a nonvolatile memory apparatus according to Embodiment 2 of the present invention.

FIG. 11 is a block diagram showing a schematic configuration of a nonvolatile memory apparatus according to Embodiment 3 of the present invention.

FIG. 12 is a graph showing the relationship between the resistance value of the resistance variable material and a cumulated time of the voltage pulses applied, in a conventional ReRAM.

FIG. 13 is a view showing temperature dependency of the resistance value of the resistance variable element in a bipolar state and the temperature dependency of the resistance value of the resistance variable element in a unipolar state.

FIG. 14 is a view showing a relationship between voltages and pulse widths of pulses and the resistance value of the resistance variable element according to Embodiment 1 of the present invention in a case where the resistance variable element is switched from the bipolar state to the unipolar state and thereafter is switched to the bipolar state again.

Figure 1:
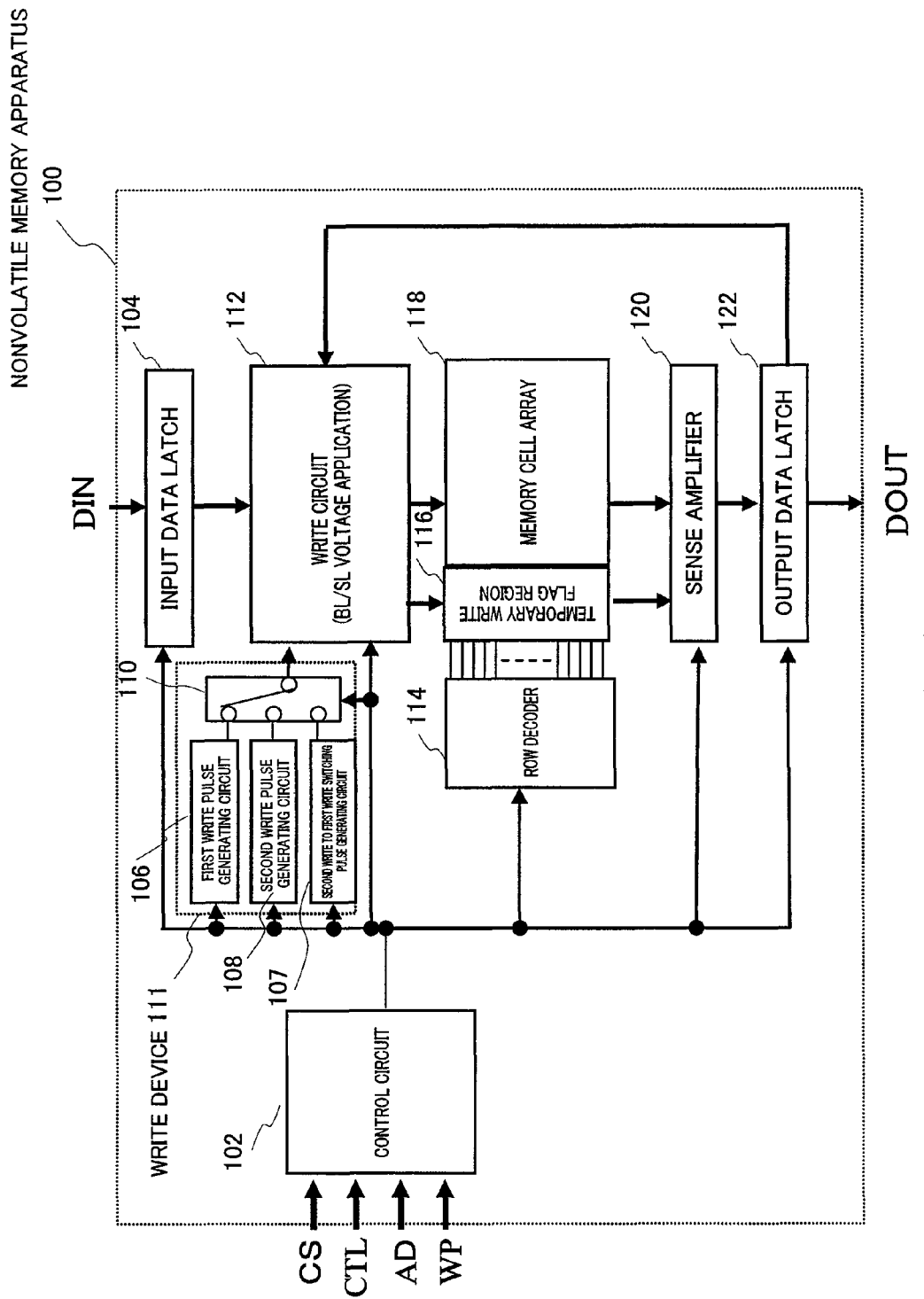
[FIG. 1]

EXPLANATION OF REFERENCE NUMERALS 100 nonvolatile memory apparatus
102 control circuit
104 input data latch
106 first write pulse generating circuit
107 second write to first write switching pulse generating circuit
108 second write pulse generating circuit
110 write pulse switching circuit
111 write device
112 write circuit
114 row decoder
116 temporary write flag region
118 memory cell array
120 sense amplifier
122 output data latch
130 bit line
132 source line
134 word line
136 selection transistor
138 resistance variable element
139 memory cell
140 voltage application circuit
142 voltage application circuit
144 NMOS transistor
146 comparator
148 reference resistor
160 nonvolatile data storage medium system
170 nonvolatile data storage medium
180 controller
190 system
192 volatile memory apparatus
200 nonvolatile memory apparatus
202 control circuit
224 second write sequence control circuit
300 nonvolatile memory apparatus
302 control circuit
324 power sequence control circuit

BEST MODE FOR CARRYING OUT THE INVENTION

Hereinafter, embodiments of the present invention will be described with reference to the drawings. The same constituents are designated by the same reference numerals and repetitive description thereof will be sometimes omitted.

Embodiment 1

Apparatus Configuration

FIG. 1 is a block diagram showing a schematic configuration of a nonvolatile memory apparatus according to Embodiment 1 of the present invention. Hereinafter, the schematic configuration and operation of the nonvolatile memory apparatus of this embodiment will be described with reference to FIG. 1.

As shown in FIG. 1, a nonvolatile memory apparatus 100 (nonvolatile memory apparatus) according to this embodiment comprises a control circuit 102, an input data latch 104, a first write pulse generating circuit 106, a second write pulse generating circuit 108, a second write to first write switching pulse generating circuit 107, a write pulse switch circuit 110, a write circuit 112, a row decoder 114, a temporary write flag region 116, a memory cell array 118, a sense amplifier 120, and an output data latch 122.

The control circuit 102 receives commands (chip select CS, external control signal CTL, address AD, write pulse WP) from a controller 180 (described later) located outside via a pin or the like, decodes the commands and outputs internal control signals (address, write mode, timing signal, and others), to control the constituents in the nonvolatile memory apparatus 100. The control circuit 102 need not be one in number, but a plurality of control circuits having their specialized functions, which are individual functions of the control circuit 102, may be provided to execute distributed control.

The input data latch 104 receives the internal control signal from the control circuit 102 and an input data signal input from a controller 180 (described later) via a data input terminal DIN, latches these data, and outputs the input data signal to a write circuit 112 as a write data signal at a specified timing.

The first write pulse generating circuit 106 (first write device) receives the internal control signal from the control circuit 102, and outputs a first write pulse (voltage pulse) when the internal control signal indicates a first write mode, and stops outputting the pulse to save electric power consumption when the internal control signal does not indicate the first write mode.

The second write pulse generating circuit 108 (second write device) receives the internal control signal from the control circuit 102, and outputs a second write pulse (voltage pulse) when the internal control signal indicates a second write mode, and stops outputting the pulse to save electric power consumption when the internal control signal does not indicate the second write mode.

The second write to first write switching pulse generating circuit 107 receives the internal control signal from the control circuit 102, and outputs the pulse (voltage pulse) for switching from second write to first write when the internal control signal indicates the second write mode, and stops outputting the pulse to save electric power consumption when the internal control signal does not indicate the second write mode.

The write pulse switching circuit 110 (write switching device) is electrically connected to an output terminal of the first write pulse generating circuit 106, to an output terminal of the second write pulse generating circuit 108, and to an output terminal of the second write to first write switching pulse generating circuit 107, to receive the outputs thereof. The write pulse switching circuit 110 receives the internal control signal from the control circuit 102, and selects the output of the first write pulse generating circuit 106 and outputs it to the write circuit 112, when the internal control signal indicates the first write mode. The write pulse switching circuit 110 selects the output of the second write pulse generating circuit 108 and outputs it to the write circuit 112, when the internal control signal indicates the second write mode. The write pulse switching circuit 110 selects the output of the second write to first write switching pulse generating circuit 107 and outputs it to the write circuit 112, when the internal control signal indicates the mode for switching from the second write to the first write.

In this embodiment, the write device 111 includes the first write pulse generating circuit 106, the second write pulse generating circuit 108, the second write to first write switching pulse generating circuit 107, and the write pulse switching circuit 110.

The memory cell array 118 includes plural bit lines and plural word lines which cross at a right angle, and memory cells provided at cross points between the bit lines and the word lines and each consisting of a transistor and a resistance variable element. The resistance state (resistance value) of the resistance variable element significantly changes in response to a voltage pulse applied. The nonvolatile memory apparatus 100 stores data utilizing a change in the resistance state. The detail of the structure of the memory cell array 118 will be described later.

The temporary write flag region 116 has a configuration similar to that of the memory cell array 118. The temporary write flag region 116 shares the word lines with the memory cell array 118. The temporary write flag region 116 includes memory cells (flag resistance variable elements) such that each of the memory cells corresponds to one sector (memory cell section) of the memory cell array 118. In this embodiment, the term "sector" means a unit including one or plural word lines of the memory cell array 118. That is, the cells connected to one word line belongs to the same sector.

The row decoder 114 is connected to the respective word lines in the memory cell array 118. The row decoder 114 receives the internal control signal from the control circuit 102 and selects the word line corresponding to address of the memory cell array 118 and the temporary write flag region 116, to/from which data is written/read, causing the word line to be in an active state, at a specified timing.

The sense amplifier 120 detects (read) a data signal (bit line data) from the memory cell array 118 and outputs the read data signal (read data signal) to the output data latch 122 at a specified timing, based on the internal control signal received from the control circuit 102.

The output data latch 122 lathes the data, switches an output destination at a specified timing, and outputs a read data signal to the controller 180 (described later) via the data output terminal DOUT or to the write circuit 112, based on the internal control signal received from the control circuit 102 and the read data signal received from the sense amplifier 120. To be specific, when the internal control signal indicates the data read mode, the output data latch 122 outputs the read data signal to the data output terminal DOUT as an output data signal, while when the internal control signal indicates the first write mode, the second write mode, or the mode for switching from second write to first write, the output data latch 122 outputs the read data signal to the write circuit 112 as a write data signal.

The write circuit 112 is connected to the respective bit lines in the memory cell array 118. The write circuit 112 receives the internal control signal from the control circuit 102 and writes data to the memory cell at a specified timing. To be specific, when the internal control signal indicates the first write mode, the write circuit 112 selects an associated bit line, and applies a first write pulse input from the write pulse switching circuit 110 to the selected bit line, based on the write data signal received from the input data latch 104 and address information contained in the internal control signal, so that the data is written to a specified address in the memory cell array 118. At the same time, "0" is written to a memory cell in the temporary write flag region 116 corresponding to the sector of the address to which the data has been written.

When the internal control signal indicates the second write mode, the write circuit 112 makes determination based on the write data signal received from the output data latch 122, selects an associated bit line based on address information contained in the internal control signal, and applies a second write pulse input from the write pulse switching circuit 110 when the data is "1" (high-resistance, first resistance value), so that the data is written to the memory cell array 118 by the second write operation. When the second write for the memory cells included in a sector is complete, "1" is written to the temporary write flag region 116 corresponding to the sector.

When the internal control signal indicates the mode for switching from second write to first write, the write circuit 112 makes determination based on write data received from the output data latch 122, selects an associated bit line based on address information contained in the internal control signal and applies to the selected bit line the pulse for switching from second write to first write which is input from the write pulse switching circuit 110, when the data is "1" (high-resistance, third resistance value), so that switching from the second write to the first write of the data occurs in the memory cell array 118. When the second write for memory cells included in a sector is complete, "0" is written to the temporary write flag region 116 corresponding to the sector. The write circuit 112 is configured to apply a voltage pulse simultaneously to plural memory cells.

Figure 2:
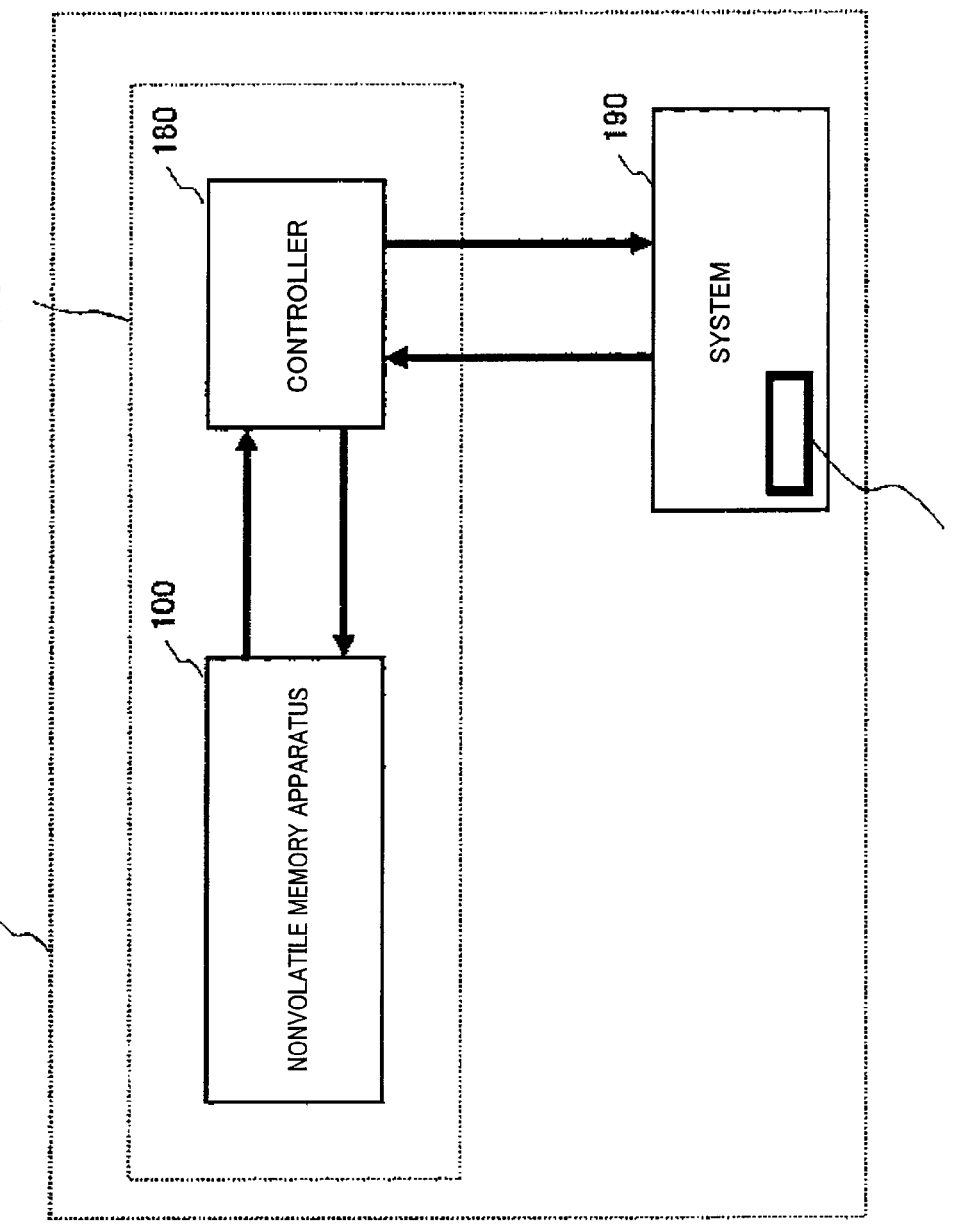
[FIG. 2]

FIG. 2 is a block diagram showing a schematic configuration of a nonvolatile data storage medium system and nonvolatile data storage medium according to Embodiment 1 of the present invention. Hereinafter, the schematic configuration and operation of a nonvolatile data storage medium 170 and nonvolatile data storage medium system 160 according to this embodiment will be described with reference to FIG. 2.

As shown in FIG. 2, the nonvolatile data storage medium 170 includes the nonvolatile memory apparatus 100 and the controller 180. The nonvolatile data storage medium system 160 includes the nonvolatile data storage medium 170 and a system 190 (e.g., mobile computer, cellular phone, etc). The system 190 includes therein a volatile memory apparatus 192 (e.g., DRAM or the like). The controller 180 receives an input data signal and an address signal from the system. 190, and outputs to the nonvolatile memory apparatus 100, a chip select CS, an external control signal CTL, an address AD, a write pulse WP, and the input data signal at specified timings. The controller 180 receives an output data signal from the nonvolatile memory apparatus 100 and outputs the output data signal to the system 190. The value of the temporary write flag region 116 is output to the controller 180 via the sense amplifier 120 and the output data latch 122 so that the controller 180 detects that the data written by the first write is present in the memory cell array 118. The system 190 uses the volatile memory apparatus 192 as a temporary storage means. To be specific, the data written to the nonvolatile memory apparatus 100 or the data read from the nonvolatile memory apparatus 100 is temporarily stored in the volatile memory apparatus 192. And, the data read from the volatile memory apparatus 192 is written to the nonvolatile memory apparatus 100 at a high speed in the first write mode. Thereafter, when the resistance variable data storage medium 170 is not selected, the controller 180 writes the first write data by the second write for long-time preservation according to a signal from the temporary write flag region.

Figure 3:
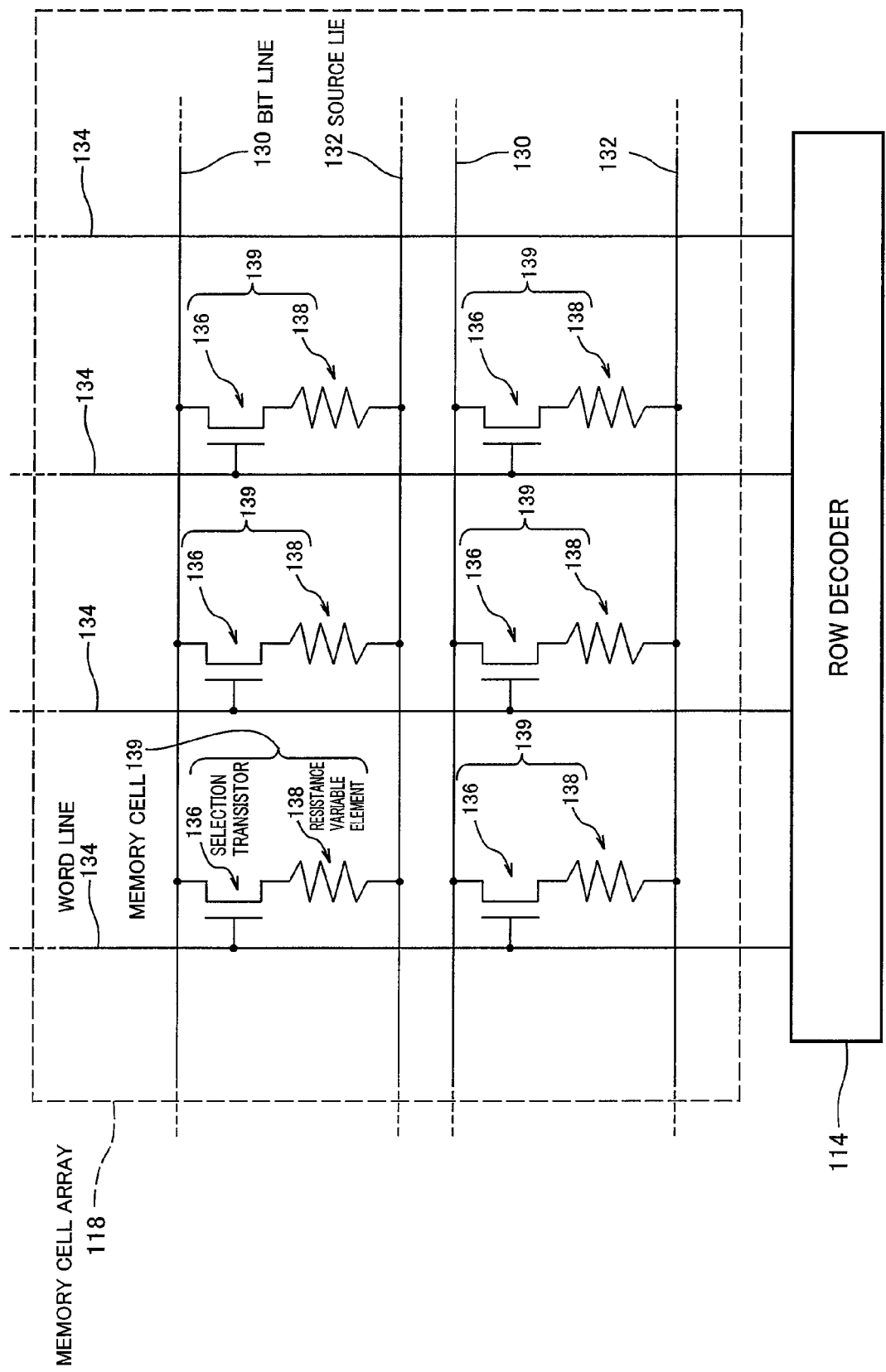
[FIG. 3]

FIG. 3 is an equivalent circuit diagram showing a schematic configuration of the memory cell array according to Embodiment 1 of the present invention. In this embodiment, the memory cell array 118 is a 1T1R (one transistor one resistance variable element) memory cell array, and includes bit lines 130 formed to extend in parallel with each other at specified intervals, source lines 132 formed to extend in parallel with the bit lines 130 at specified intervals, and word lines 134 formed to extend in parallel with each other at specified intervals so as to cross the bit lines 130 and the source lines 132 at a right angle. The bit lines 130 and the source lines 132 are formed such that one bit line 130 and one source line 132 are arranged in an alternate manner. A pair of bit line 130 and source line 132 are electrically connected to each other via a memory cell 139 provided at each cross point between the bit line 130 and the word line 134 and consisting of one selection transistor 136 and one resistance variable element 138 which are connected to each other in series. The bit line 130 is electrically connected to the drain electrode of the selection transistor 136, the source electrode of the selection transistor 136 is electrically connected to one end of the resistance variable element 138, the other end of the resistance variable element 138 is electrically connected to the source line 132, and the gate electrode of the selection transistor 136 is electrically connected to the word line 134. The row decoder 114 is connected to the respective word lines 134. The row decoder 114 selects a word line 134 to be accessed and applies a voltage (activates) to the word line 134, based on the internal control signal received from the control circuit 102, causing the selection transistor 136 to be in an electrically-conductive state. When the data is written and read, a target resistance variable element 138 is specified according to a combination of the bit line 130, the source line 132, and the word line 134, and a voltage is applied between the bit line 130 and the source line 132 or a current flowing between them is detected. The data is stored in the memory cell 139 such that the data corresponds to the resistance value of the resistance variable element 138. The low-resistance (LR: about 2 kΩ to 5 kΩ) state is allocated to the value "0" of binary data, while the high-resistance (HR: about 1M to 60MΩ) state is allocated to the value "1" of the binary data.

Figure 4:
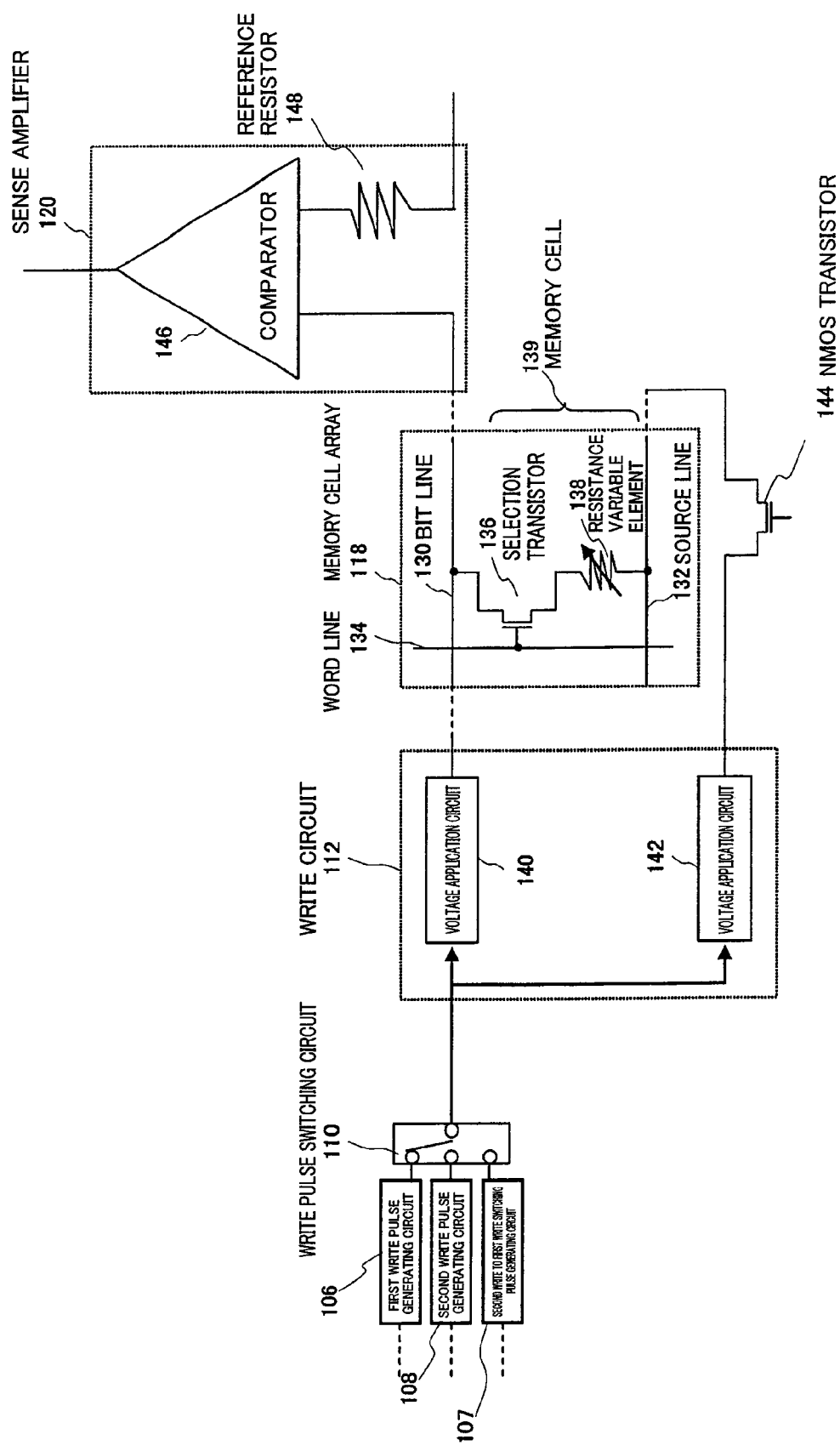
[FIG. 4]

FIG. 4 is a diagram showing a schematic configuration of a circuit for writing and reading data to and from a memory cell according to Embodiment 1 of the present invention. As shown in FIG. 4, the write circuit 112 includes a voltage application circuit 140 and a voltage application circuit 142, although not shown in FIG. 1. The sense amplifier 120 includes a comparator 146 and a reference resistor 148. A NMOS transistor 144 is disposed between the source line 132 of the memory cell array 118 and the voltage application circuit 142 of the write circuit 112. In this embodiment, the write circuit 112 includes voltage application circuits 140 and voltage application circuits 142 which are equal in number (the number of memory cells corresponding to one address, e.g., sixteen memory cells) to which the voltage pulse is applied simultaneously. In this embodiment, the NMOS transistors 144 are arranged in a peripheral region of the memory cell array 118. The NMOS transistors 144 may be provided such that one NMOS transistor 144 corresponds to plural source lines 132 or corresponds to one source line 132.

The write pulse switching circuit 110 selectively connects the first write pulse generating circuit 106, the second write pulse generating circuit 108, or the second write to first write switching pulse generating circuit 107, to the write circuit 112. The pulse output from the write pulse switching circuit 110 is input to the voltage application circuit 140 and to the voltage application circuit 142.

When the internal control signal received in the write circuit 112 indicates the first write mode, the voltage application circuit 140 outputs a high voltage (+2V) or 0V to the selected bit line 130 such that the output voltage is switched according to the data to be written during a period in which the input pulse is at H level, while the voltage application circuit 142 outputs 0V or a high voltage (+2V) to the source line 132 associated with the selected bit line 130 such that the output voltage is switched according to the data to be written during a period in which the input pulse is at H level.

When the internal control signal received in the write circuit 112 indicates the second write mode, the voltage application circuit 140 outputs 0V to the selected bit line 130 during a period in which the input pulse is at H level, while the voltage application circuit 142 selectively outputs a high voltage (+2V) or a high voltage (+5V) to the source line 132 associated with the selected bit line 130 according to the data to be written during a period in which the input pulse is at H level.

When the internal control signal received in the write circuit 112 indicates the mode for switching from the second write to the first write, the voltage application circuit 140 outputs a high voltage (+5V) to the selected bit line 130 during a period in which the input pulse is at H level, while the voltage application circuit 142 outputs 0V to the source line 132 associated with the selected bit line 130 during a period in which the input pulse is at H level.

In contrast, when the internal control signal received in the write circuit 112 indicates a read mode, the voltage application circuit 140 causes its output end to be in a high-impedance state (non-electrically-conductive state), while the voltage application circuit 142 outputs 0V to the source line 132.

The output end of the voltage application circuit 140 is connected to one end of the bit line 130 of the memory cell array 118. The input terminal of the comparator 146 included in the sense amplifier 120 is connected to the other end of the bit line 130. The reference resistor 148 is connected to the other input terminal of the comparator 146. The output end of the voltage application circuit 142 is connected to one end of the source line 132 via the NMOS transistor 144. The selection transistor 136 and the resistance variable element 138 are connected in series between the bit line 130 and the source line 132 at each cross point between the bit line 130 and the word line 134. The gate of the selection transistor 136 is connected to the word line 134. The gate of the NMOS transistor 144 is connected to the row decoder 114 (see FIG. 1).

[Voltage Pulse and Resistance Switching of Resistance Variable Material]

The resistance variable element 138 is formed to include a resistance variable layer between electrode materials such as Pt. As the resistance variable material (material of resistance variable layer) of the resistance variable element 138, various materials may be used. A transition metal oxide such as an iron oxide mixture ($Fe_2O_3/Fe_3O_4$ or $ZnFe_2O_4/Fe_3O_4$) is especially suitably used.

To be specific, the resistance variable layer of the resistance variable element 138 preferably includes an iron oxide. More preferably, the resistance variable layer includes an iron oxide mixture ($Fe_2O_3/Fe_3O_4$ or $ZnFe_2O_4/Fe_3O_4$). The resistance variable layer may be made of an iron oxide. The resistance variable layer may be made of the iron oxide mixture ($Fe_2O_3/Fe_3O_4$ or $ZnFe_2O_4/Fe_3O_4$).

The resistance variable element 138 includes a lower electrode and an upper electrode. Various materials are used as electrode materials of the lower electrode and the upper electrode. The electrode materials of the lower electrode and the upper electrode may be different. The lower electrode and the upper electrode of the resistance variable element 138 are preferably made of platinum (Pt).

To be specific, the resistance variable element 138 must be configured to attain both a bipolar operation and a unipolar operation. Such an element is capable of being switched between the bipolar state and the unipolar state by appropriately controlling the electric pulse applied with reference to the recitation of the subject specification.

Figure 5:
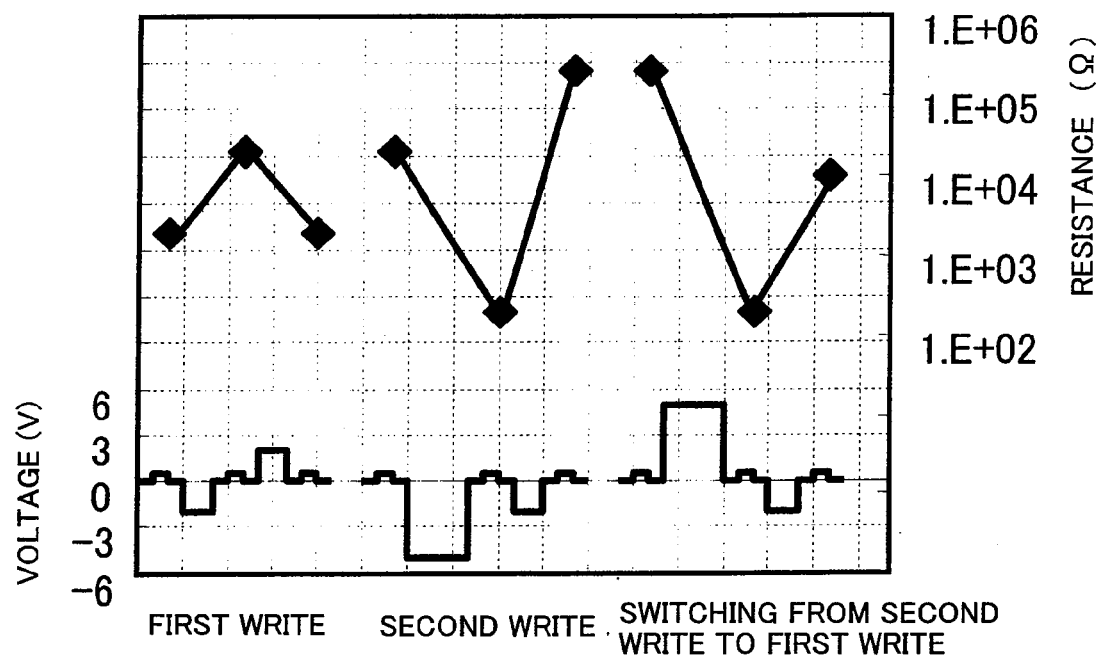
[FIG. 5]

FIG. 5 is a view showing a change in a resistance value which occurs when an electric pulse is applied to the resistance variable element 138 of FIG. 3.

Figure 6:
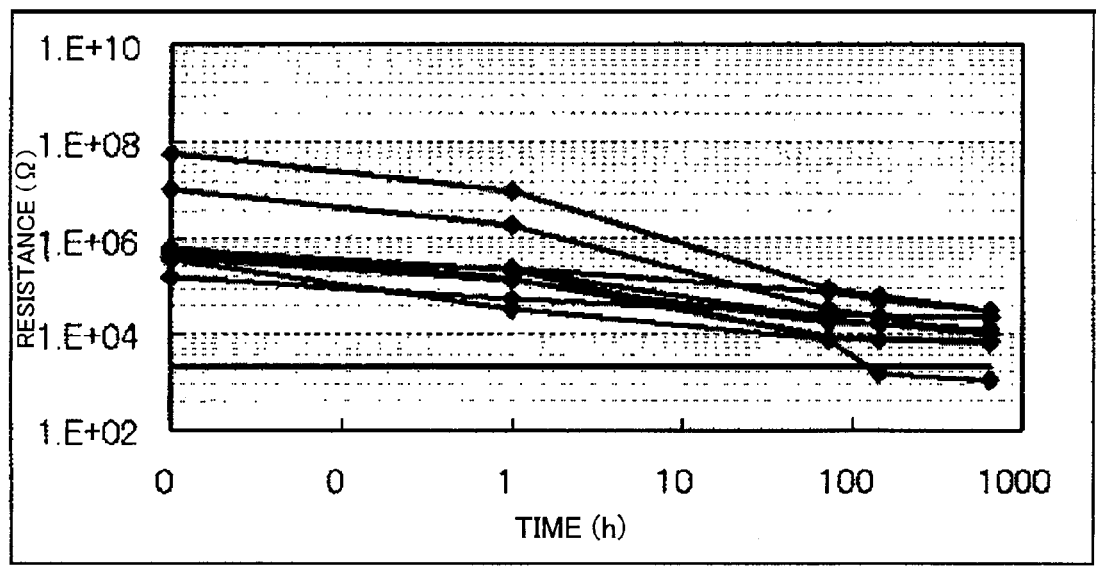
[FIG. 6] FIG. 6($a$) is a graph showing a 85 degrees centigrade retention characteristic (retention) obtained by performing only a first write operation, and FIG. 6($b$) is a graph showing a 85 degrees centigrade retention characteristic (retention) obtained by performing a second write operation after the first write operation is performed.
Figure 6:
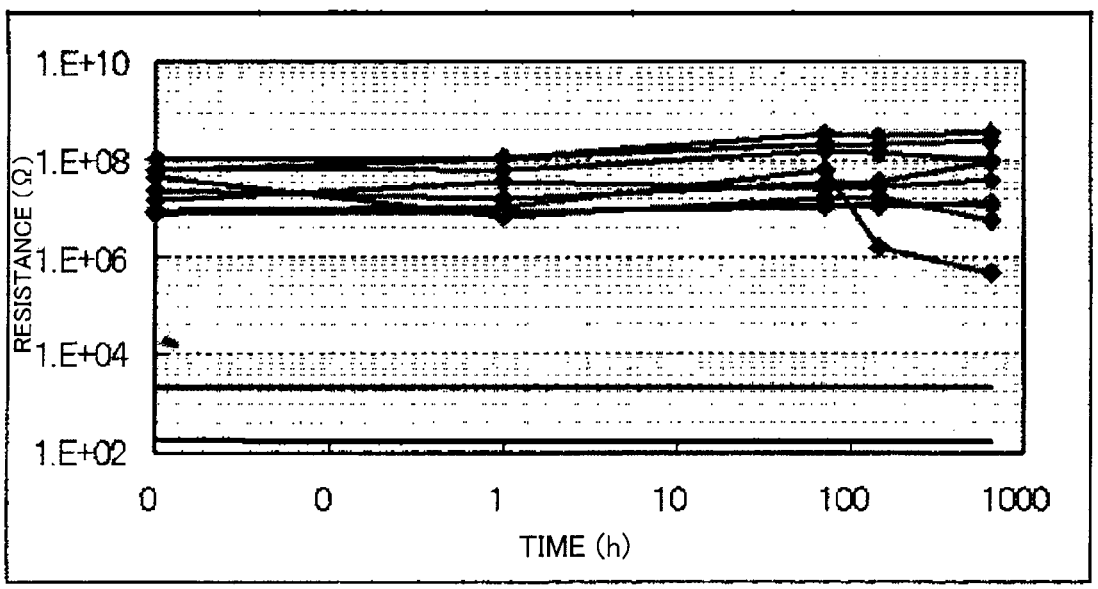

In the first write mode, when a negative pulse (e.g., voltage: −2V, pulse width:120 ns) is applied to the resistance variable element 138 having the value "0" and being in a first low-resistance state, for example, the resistance value of the resistance variable element 138 is switched from the first low-resistance state to a first high-resistance state, so that a new value "1" is written to the resistance variable element 138. Also, when a positive pulse (e.g., voltage: +2V, pulse width: 120 ns) is applied to the resistance variable element 138 having the value "1" and being in the first high-resistance state, the resistance value of the resistance variable element 138 is switched from the first high-resistance state to the first low-resistance state, so that a new value "0" is written to the resistance variable element 138. FIG. 6(*a*) shows a 85 degrees centigrade retention characteristic (retention) obtained by performing only the first write operation. As can be seen, the retention time is about 100 hours.

FIG. 6(*a*) shows data of the resistance variable element (electrode area: 0.25 $\mu m^2$, thickness of resistance variable layer: 100 nm, producing method of resistance variable layer: sputtering) in which platinum (Pt) is used as the material of the upper electrode and the lower electrode and $Fe_2O_3/Fe_3O_4$ is used as the resistance variable material.

The positive voltage is defined as a voltage with which the upper electrode of the resistance variable element 138 is at a positive electric potential based on the lower electrode of the resistance variable element 138 as a reference, while the negative voltage is defined as a voltage with which the upper electrode of the resistance variable element 138 is at a negative electric potential based on the lower electrode of the resistance variable element 138 as a reference.

The first low-resistance state is a bipolar low-resistance state (first resistance value). The first high-resistance state is a bipolar high-resistance state (second resistance value and third resistance value). The negative pulse is a bipolar high-resistance state attaining pulse (first electric pulse) and the positive pulse is a bipolar low-resistance state attaining pulse (second electric pulse).

For example, as can be shown in a graph at the left side of FIG. 5, in the resistance variable element (electrode area: 0.25 $\mu m^2$, thickness of resistance variable layer: 100 nm, producing method of resistance variable layer: sputtering) in which platinum (Pt) is used as the material of the upper electrode and the lower electrode and $Fe_2O_3/Fe_3O_4$ is used as the resistance variable material, when a negative pulse (voltage: −2V, pulse width: 120 ns) is applied to the resistance variable element 138 in the bipolar low-resistance state (about 2 kΩ), the resistance variable element 138 is switched to the bipolar high-resistance state (about 20 kΩ), while when a positive pulse (voltage: +2V, pulse width: 120 ns) is applied to the resistance variable element 138 in the bipolar high-resistance state, the resistance variable element 138 is switched to the bipolar low-resistance state (about 2 kΩ).

In the second write mode, when a long negative pulse (e.g., voltage: −5V, pulse width: 1 ms) is applied to the resistance variable element 138 having the value "1" and being in the first high-resistance state, the resistance value of the resistance variable element 138 is switched from the first high-resistance state to the second low-resistance state, while when the negative pulse (e.g., voltage: −2V, pulse width: 120 ns) is applied to the resistance variable element 138, the resistance value of the resistance variable element 138 is switched from the second low-resistance state to the second high-resistance state, so that the value "1" to be retained a long time (about 10 years) is written. FIG. 6(*b*) shows a 85 degrees centigrade retention characteristic (retention) obtained by performing the second write operation after the first write operation is performed. The retention time is about 1000 hours or longer because of the second write operation.

The resistance variable element of FIG. 6(*b*) is identical to the resistance variable element of FIG. 6(*a*).

The second low-resistance state is the unipolar low-resistance state (fourth resistance value). The second high-resistance state is the unipolar high-resistance state (fifth resistance value). The long negative pulse is a unipolar switching long pulse (third electric pulse). The negative pulse is a unipolar switching short pulse (fourth electric pulse). In this embodiment, the unipolar switching long pulse is a unipolar low-resistance state attaining pulse and the unipolar switching short pulse is a unipolar high-resistance state attaining pulse.

As shown in a graph at the center of FIG. 5, in the resistance variable element (electrode area: 0.25 $\mu m^2$, thickness of resistance variable layer: 100 nm, producing method of resistance variable layer: sputtering) in which platinum (Pt) is used as the material of the upper electrode and the lower electrode and $Fe_2O_3/Fe_3O_4$ is used as the resistance variable material, when a long negative pulse (voltage: −5V, pulse width: 1ms) is applied to the resistance variable element in the bipolar high-resistance state, the resistance variable element is switched to the unipolar low-resistance state (about 200Ω), and when a negative pulse (voltage: −2V, pulse width: 120 ns) is further applied to the resistance variable element, the resistance variable element is switched to the unipolar high-resistance state (about 200 kΩ). Also, when a long negative pulse (voltage −5V, pulse width: 1ms) is applied to the resistance variable element in the unipolar high-resistance state, the resistance variable element is switched to the unipolar low-resistance state (about 200Ω), while when a negative pulse (−2V, pulse width: 120 ns) is applied to the resistance variable element in the unipolar low-resistance state, the resistance variable element is switched to the unipolar high-resistance state (about 200 kΩ).

In the mode for switching from second write to first write, when a long positive pulse (e.g., voltage: +5V, pulse width: 1 ms) is applied to the resistance variable element having the value "1" to be retained for a long time and being in the second high-resistance state, the resistance value of the resistance variable element is switched from the second high-resistance state to the second low-resistance state, and when the negative pulse (e.g., voltage −2V, pulse width: 120 ns) is applied to the resistance variable element, the resistance value of the resistance variable element is switched from the second low-resistance state to the first high-resistance state, so that "1" for the high-speed operation is written in the first write mode.

The long positive pulse is a write switching pulse. The negative pulse is the bipolar high-resistance state attaining pulse. When the write switching pulse is applied to the element in the unipolar high-resistance state, the element is switched to the bipolar low-resistance state (first low-resistance state).

As shown in a graph at the right side of FIG. 5, in the resistance variable element (electrode area: 0.25 $\mu m^2$, thickness of resistance variable layer: 100 nm, producing method of resistance variable layer: sputtering) in which platinum (Pt) is used as the material of the upper electrode and the lower electrode and $Fe_2O_3/Fe_3O_4$ is used as the resistance variable material, when a long positive pulse (voltage: +5V, pulse width: lms) is applied to the resistance variable element in the unipolar high-resistance state (about 200 kΩ), the resistance variable element is switched to the bipolar low-resistance state (about 600Ω), and when a negative pulse (voltage: −2V, pulse width: 120 ns) is further applied to the resistance variable element, the resistance variable element is switched to the bipolar high-resistance state (about 10 kΩ).

Figure 14:
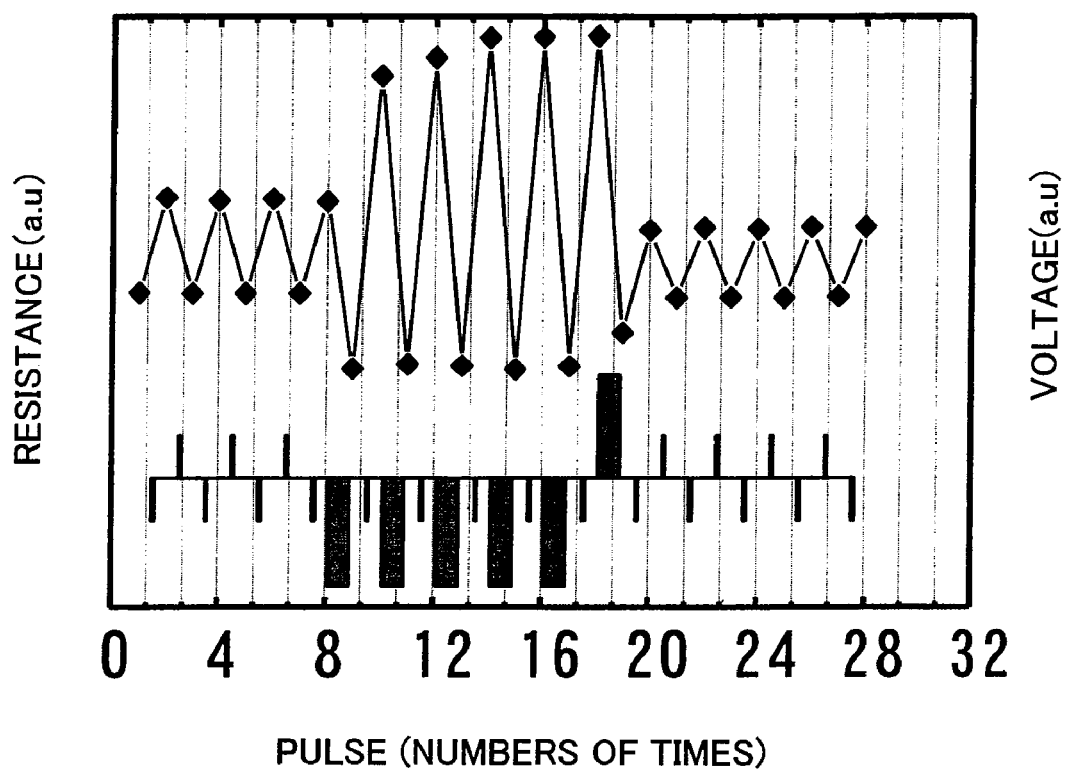
[FIG. 14]

FIG. 14 is a view showing a relationship between voltages and pulse widths of pulses and resistance values of the resistance variable element in a case where the resistance variable element is switched from the bipolar state to the unipolar state and thereafter is switched to the bipolar state again.

As shown in FIG. 14, when a negative pulse is applied to the resistance variable element in the bipolar low-resistatice state, the resistance variable element is switched to the bipolar high-resistance state (e.g., first pulse). When the positive pulse is applied to the resistance variable element in the bipolar high-resistance state, the resistance variable element is switched to the bipolar low-resistance state (e.g., second pulse). This is "first write."

When a long negative pulse is applied to the resistance variable element in the bipolar high-resistance state, the resistance variable element is switched from the bipolar high-resistance state to the unipolar low-resistance state (eighth pulse). When a negative pulse is applied to the resistance variable element in this state, the resistance variable element is switched to the unipolar high-resistance state (ninth pulse). The write using the eighth pulse and the ninth pulse is "second write."

When a long negative pulse is applied to the resistance variable element in the unipolar high-resistance state, the resistance variable element is switched to the unipolar low-resistance state (e.g., tenth pulse). When a negative pulse is applied to the resistance variable element in the unipolar low-resistance state, the resistance variable element is switched to the unipolar high-resistance state (e.g., eleventh pulse). This is "unipolar write."

When a long positive pulse is applied to the resistance variable element in the unipolar high-resistance state, the resistance variable element is switched to the bipolar low-resistance state (eighteenth pulse). When a negative pulse is applied to the resistance variable element in this state, the resistance variable element is switched to the bipolar high-resistance state (nineteenth pulse). The write using the eighteenth pulse and the nineteenth pulse is "switching from second write to first write."

When "switching from second write to first write" is complete, the resistance variable element is placed in a state where the element is alternately switched between the bipolar high-resistance state and the bipolar low-resistance state by "first write" (twentieth and the following pulses).

In a case where "0" is directly written to the resistance variable element in the unipolar high-resistance state ("1") in "switching from second write to first write," it is not necessary to switch the resistance variable element to the bipolar high-resistance state.

In this embodiment, the unipolar state is used to preserve the high-resistance state for a long period. Therefore, in this embodiment, "second write" is performed, but "unipolar write" is not.

[Operation]

Hereinafter, a read operation and a write operation of data which are performed using the nonvolatile memory apparatus 100 will be described in detail with reference to FIGS. 1 to 4.

First, the read operation of data will be described. When reading the data, the row decoder 114 activates a specified word line 134 according to a chip select CS and an address AD which are input from the controller 180, and causes a selection transistor 136 connected to this word line to be in an electrically-conductive state. The row decoder 114 also causes the associated NMOS transistor 144 to be in an electrically-conductive state. Then, the voltage application circuit 140 is set to a high-impedance state (non-electrically-conductive state), and the voltage application circuit 142 is set to 0V. With such control, there is formed a current path extending from the comparator 146 to the voltage application circuit 142 through the selection transistor 136, the resistance variable element 138 and the NMOS transistor 144. The comparator 146 includes a voltage application circuit, which applies an equal voltage to the current path and to the reference resistor 148. The comparator 146 compares a current flowing in the current path to a current flowing in the reference resistor 148, so that data (resistance value of resistance variable element 138) is read from the memory cell.

Hereinafter, the detail will be described. By way of example, it is supposed that the value of the reference resistor 148 is set to 200 kΩ. When the state of the resistance variable element 138 of the selected memory cell 139 is a low-resistance state (corresponding to the value "0"), the resistance value (=2 kΩ) of the path <resistance value (=200 kΩ) of the reference resistor. Therefore, the current flowing in the path is larger than the current flowing in the reference resistor 148, and the comparator 146 outputs a high level. Conversely, when the state of the selected memory cell is a high-resistance state (corresponding to the value "1"), the resistance value (=1MΩ first high-resistance value, 60MΩ second high-resistance value) of the path >resistance value (=200 kΩ) of the reference resistor. Therefore, the current flowing in the path is smaller than the current flowing in the reference resistor 148, and the comparator 146 outputs a low level. With this operation, the state of the selected memory cell is read as an output level (read data signal) of the comparator 146, taken out to the data output terminal DOUT as an output data signal via the output data latch 122, and sent to the system 190 by way of the controller 180.

Figure 7:
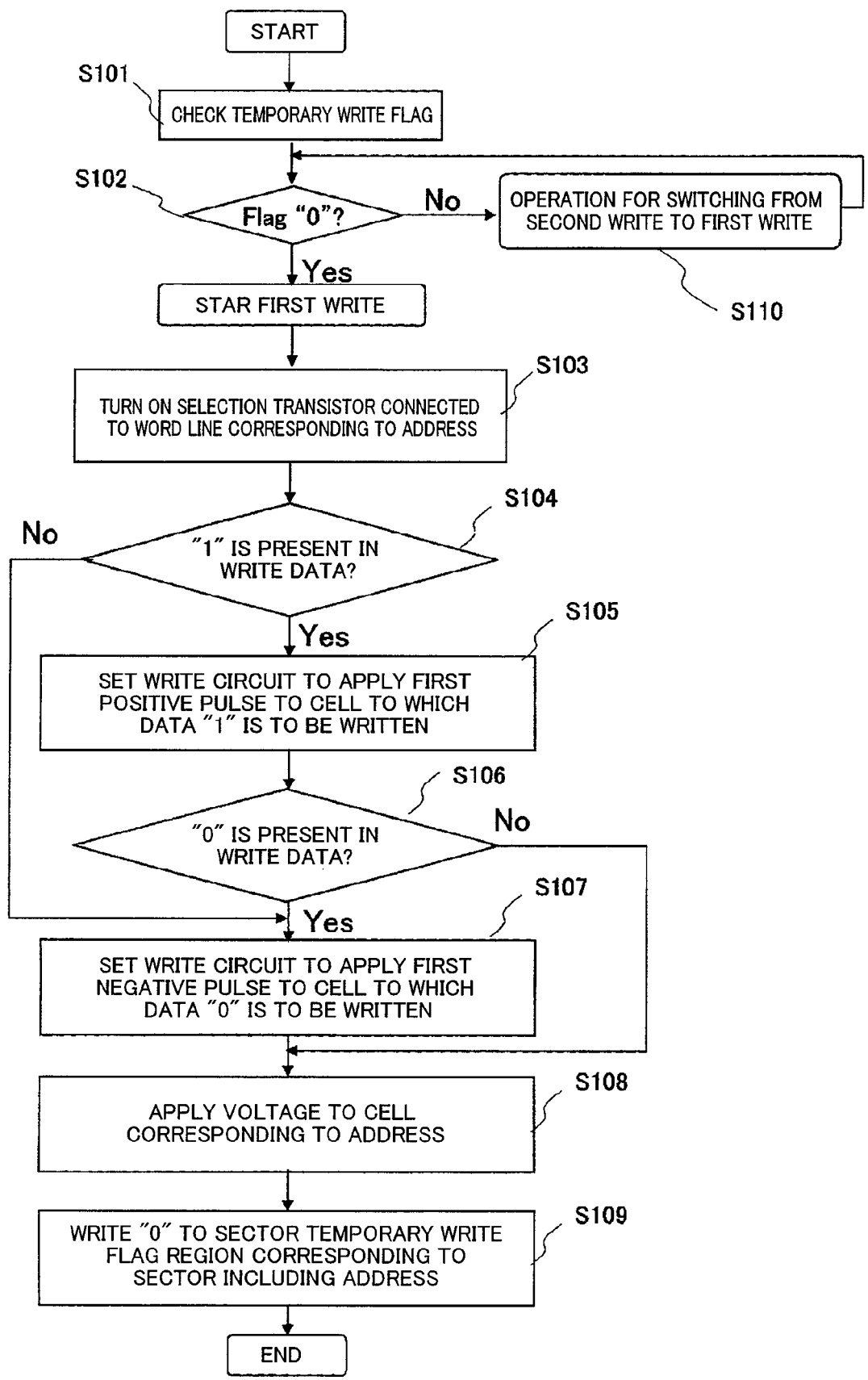
[FIG. 7]
Figure 8:
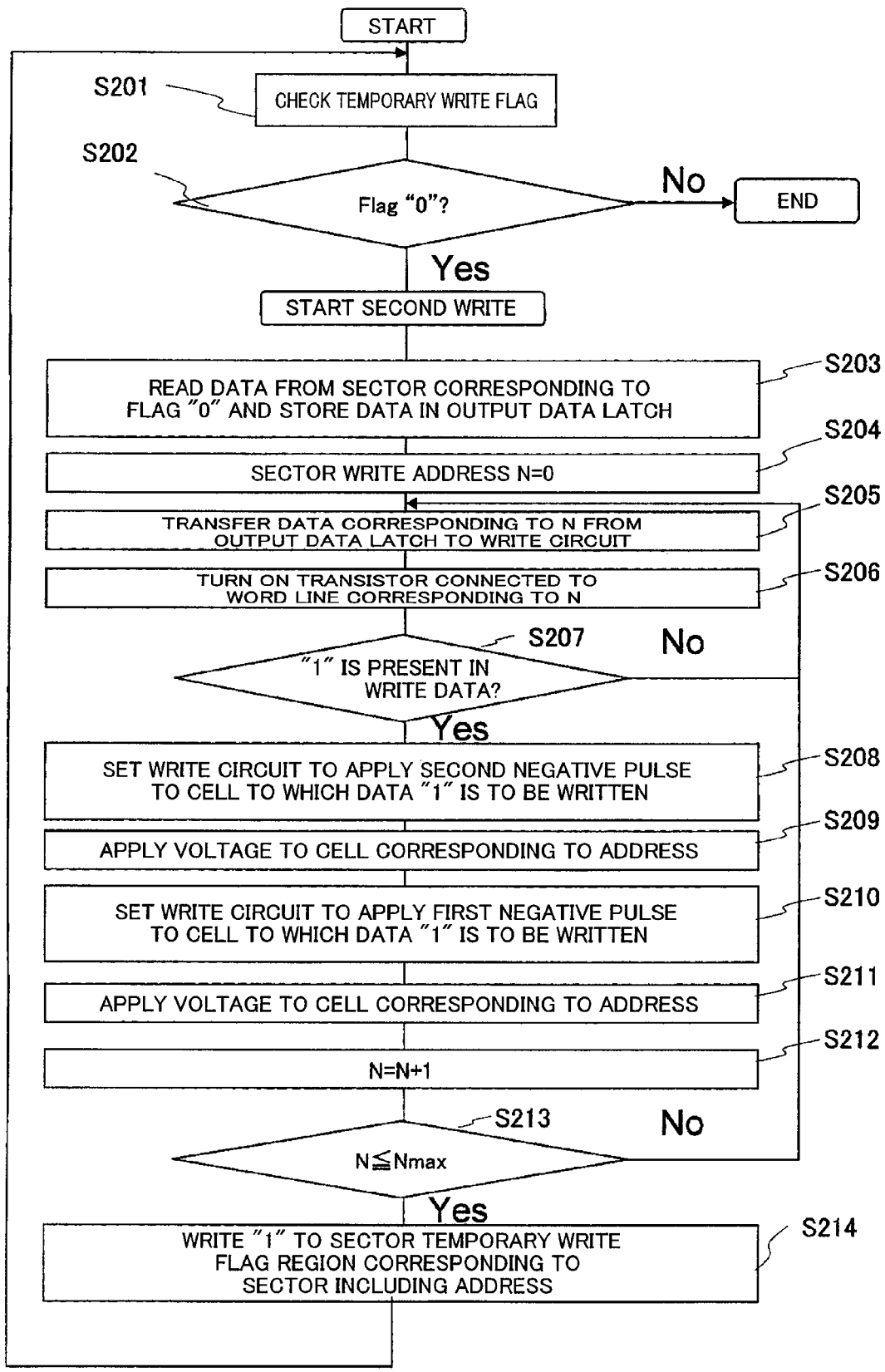
[FIG. 8]
Figure 9:
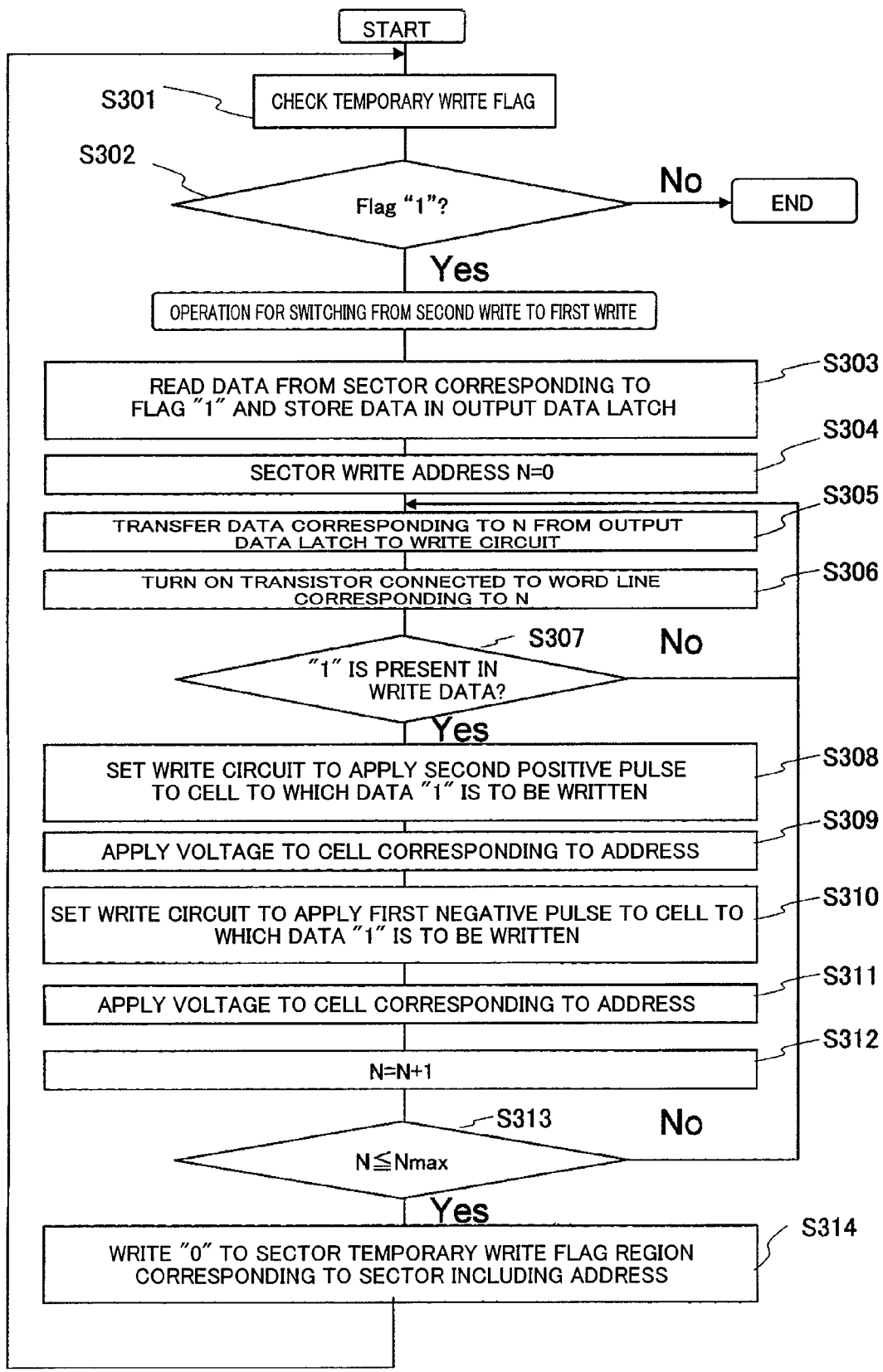
[FIG. 9]

Subsequently, the write operation of data which is a feature of the nonvolatile memory apparatus 100 will be described. The write operation of the nonvolatile memory apparatus 100 is classified according to the mode. FIG. 7 is a flowchart schematically showing the first write operation according to Embodiment 1 of the present invention. FIG. 8 is a flowchart schematically showing the second write operation according to Embodiment 1 of the present invention. FIG. 9 is a flowchart schematically showing the operation for switching from second write to first write according to Embodiment 1 of the present invention.

When writing data, the write circuit 112 and the row decoder 114 select a specified memory cell 139 and perform writing according to the internal control signal. Both ends (bit line 130 and source line 132) of the memory cell 139 are electrically connected to the voltage application circuit 140 and to the voltage application circuit 142, respectively. A desired voltage pulse is applied to the resistance variable element 138, attaining switching of the resistance value.

The first write operation will be descried with reference to FIG. 7. When the controller 180 receives the input data signal and the address signal from the system 190, it sends a command to the nonvolatile memory apparatus 100. The data input through the data input terminal DIN is stored (latched) in the input data latch 104, and the internal control signal output from the control circuit 102 is set to the first write mode, so that the operation starts (START).

Initially, the controller 180 controls the control circuit 102 such that data is read from the temporary write flag region 116 corresponding to respective sectors and it is determined whether or not there is a flag having the value "0" (step S102). The data read operation for the temporary write flag region 116 is similar to the read operation for the memory cell array 118 and will not be described repetitively. If it is determined as "NO" in step S102, all of the memory cells are in the second write mode, and therefore the operation for switching from second write to first write is performed (step S301~). If it is determined as "YES" in step S102, the memory cells are in a state where it is capable of the first write operation.

Subsequently, an activation voltage (e.g., +5V) is applied to a word line 134 corresponding to an address indicated by an address AD, while an inactivation voltage (e.g., 0V) is applied to other word lines 134. With this operation, a selection transistor 136 of the address to which the data is to be written is turned to an electrically-conductive state (step S103). At this time, the associated NMOS transistor 144 is also turned to an electrically-conductive state.

The data to be written is constituted by binary number (bits) having binary values "1" and "0," and plural (e.g., sixteen) bits are assigned for one address. Accordingly, first, it is determined whether or not "1" is present in the write data (step S104). If it is determined as "YES," the write circuit 112 is set to apply the first positive pulse to a memory cell 139 to which "1" is to be written (step S105). That is, the write circuit 112 is set so that +2V is applied to the voltage application circuit 140 side of the memory cell and 0V is applied to the voltage application circuit 142 side of the memory cell.

The first positive pulse is a bipolar low-resistance state attaining pulse (second electric pulse). By applying the first positive pulse, the element is switched from the bipolar high-resistance state to the bipolar low-resistance state.

Then, it is determined whether or not "0" is present in the write data (step S106). If it is determined as "YES," the write circuit 112 is set to apply the first negative pulse to a memory cell 139 to which "0" is to be written (step S107). That is, the write circuit 112 is set so that 0V is applied to the voltage application circuit 140 side of the memory cell and +2V is applied to the voltage application circuit 142 side of the memory cell. If it is determined as "NO" in step S102, "0" is written to all the cells, and the process goes to step S105, in which the write circuit 112 is set to apply the negative pulse to all the cells corresponding to the address.

The first negative pulse is a bipolar high-resistance state attaining pulse (first electric pulse). By applying the first negative pulse, the element is switched from the bipolar low-resistance state to the bipolar high-resistance state.

Then, a voltage pulse output from the first write pulse generating circuit 106 is applied to the memory cell 139 corresponding to the address to which the data is to be written (step S108). Even if it is determined as "NO" in step S106, step S108 is performed.

In step S108, for the cell to which "1" is to be written, the voltage application circuit 140 applies a voltage of +2V to one end of the resistance variable element 138 via the bit line 130 and the selection transistor 136 for a specified time (e.g., 120 ns), while the voltage application circuit 142 applies a voltage of 0V to the other end of the resistance variable element 138 via the NMOS transistor 144 and the source line 132 for the specified time (e.g., 120 ns). With the voltage application, the resistance state of the resistance variable element 138 transitions from a low-resistance state (e.g., about 2 kΩ) to a high-resistance state (e.g., about 2MΩ) in which the resistance value is lower than the resistance value corresponding to a target high-resistance state.

For the cell to which "0" is to be written, the voltage application circuit 140 applies a voltage of 0V to one end of the resistance variable element 138 via the bit line 130 and the selection transistor 136 for a specified time (e.g., 120 ns), while the voltage application circuit 142 applies a voltage of +2V to the other end of the resistance variable element 138 via the NMOS transistor 144 and the source line 132 for the specified time (e.g., 120 ns). That is, the pulses which are opposite in polarity to the pulses which are applied in positive pulse writing are applied. With this voltage application, the resistance state of the resistance variable element 138 transitions from a high-resistance state (e.g., about 1MΩ) to a low-resistance state (e.g., about 2 kΩ) in which the resistance value is higher than the resistance value corresponding to a target low-resistance state.

When step S108 is complete, "0" is written to a flag resistance variable element in the temporary write flag region 116 corresponding to the sector containing the address to which the first write has been performed (step S109). Since the write operation for the temporary write flag region 116 is similar to the write operation for the memory cell 139 of the memory cell array 118, it will not be described repetitively.

When writing of data to the temporary write flag is complete, the writing of data to the address is ended (END). Time of about 120 ns is needed to perform the first write once. In the nonvolatile memory apparatus 100, temporary write operation from step S101 to S109 is repeated, thereby writing a series of data to the respective addresses by the first write.

Subsequently, the second write operation will be described with reference to FIG. 8. When the writing of data to the respective addresses is complete, and the command for writing and the command for reading with respect to the nonvolatile data storage medium 170, which are sent from the system 190, are stopped, the control circuit 102 selects the second write mode in accordance with the control of the controller 180, so that the second write operation starts (START).

Initially, the controller 180 controls the control circuit 102 such that data is read from the temporary write flag region 116 corresponding to respective sectors and it is determined whether or not there is a flag having the value "0" (step S202). The data read operation for the temporary write flag region 116 is similar to the read operation for the memory cell array 118, and will not be described repetitively. If it is determined as "NO" in step S102, the second write for all the memory cells are complete, and it is not necessary to perform the second write operation (END). On the other hand, if it is determined as "YES" in step S202, the second write operation having a series of procedures is performed in accordance with the control of the controller 180 (step S203~).

Initially, all data ("1" or "0") stored in sector (hereinafter second write target sector) corresponding to the flag "0" is read and stored in the output data latch 122 (write data memory device) (step S203).

Then, zero is assigned to a variable N indicating the sector write address of the second write target sector (step S204). Data corresponding to unit write bit number (e.g., 16 bits), is taken out from among the stored data, and is transferred from the output data latch 122 to the write circuit 112 (step S205).

When the write circuit 112 receives data, the activation voltage (+5V) is applied to the word line 134 corresponding to the N-th sector write address of the sector, while the inactivation voltage (e.g., 0V) is applied to other word lines 134. With this operation, the selection transistor 136 of the cell to which data is to be written by the second write is turned to an electrically-conductive state (step S206). At this time, the associated NMOS transistor 144 is also turned to an electrically-conductive state.

Then, it is determined whether or not "1" is present in the write data (data stored in the cell corresponding to the sector write address N) transferred to the write circuit 112 (step S207). If it is determined as "YES," the write circuit 112 is set to apply the second negative pulse to the cell (cell in the memory cell array 218) to which "1" is to be written by the second write (step S208). That is, the write circuit 112 is set so that −5V is applied to the voltage application circuit 140 side of the memory cell and 0V is applied to the voltage application circuit 142 side of the memory cell, and voltages are applied (step S209). Then, the write circuit 112 is set to apply the first negative pulse to the cell (step S210). That is, the write circuit 112 is set so that −2V is applied to the voltage application circuit 140 side of the memory cell and 0V is applied to the voltage application circuit 142 side of the memory cell, and voltages are applied (step S211).

The second negative pulse is a unipolar switching long pulse (third electric pulse). The first negative pulse is a unipolar switching short pulse (fourth electric pulse). By applying these two pulses sequentially, the element is switched from the bipolar high-resistance state to the unipolar high-resistance state.

If it is determined as NO in step S207, the process returns to step S205.

When step S210 is complete, one is added to N (step S212). It is determined whether or not N is larger than Nmax (step S213). If it is determined that N is not larger than Nmax, the process returns to step 204. With this operation, the second write is performed sequentially for the sector write addresses N=1, 2, . . . , Nmax. When N is larger than Nmax, the second write for the associated sector is complete. Therefore, "1" is written to the temporary write flag region corresponding to the sector for resetting (step S214), and the process returns to step S201. The write operation for the temporary write flag region 116 is similar to the write operation for the cell in the memory cell array 218, and will not be described repetitively.

The nonvolatile memory apparatus 100 repeats the operation from step S201 to step S213 to perform the second write sequentially until "1" is written to the flags corresponding to all of the sectors.

Subsequently, the operation for switching from second write to first write will be described with reference to FIG. 9. When the writing of data to the respective addresses is complete, and the command for writing and the command for reading with respect to the nonvolatile data storage medium 170, which are sent from the system 190, are stopped, the control circuit 102 selects the mode for switching from second write to first write in accordance with the control of the controller 180, so that the switching operation starts (START).

Initially, the controller 180 controls the control circuit 102 such that data is read from the temporary write flag region 116 corresponding to respective sectors and it is determined whether or not there is a flag having the value "1" (step S302). The data read operation for the temporary write flag region 116 is similar to the read operation for the memory cell array 118, and will not be described repetitively. If it is determined as "NO" in step S302, all the memory cells are in the first write operation mode, and therefore, it is not necessary to perform the switching operation (END). On the other hand, if it is determined as "YES" in step S302, the switching write operation having a series of procedures is performed in accordance with the control of the controller 180 (step S303~).

Initially, all data ("1" or "0") stored in sector (hereinafter switching target sector) corresponding to the flag having a value "1" is read and stored in the output data latch 122 (write data memory device) (step S303).

Then, 0 is assigned to a variable N indicating the sector write address of the switching write target sector (step S304).

Data corresponding to unit write bit number (e.g., 16 bits) is taken out from among the stored data, and transferred from the output data latch 122 to the write circuit 112 (step S305).

When the write circuit 112 receives data, the activation voltage (+5V) is applied to a word line 134 corresponding to the N-th sector write address of the sector, while the inactivation voltage (e.g., 0V) is applied to other word lines 134. With this operation, the selection transistor 136 of the cell to which data is to be written by the second write is turned to an electrically-conductive state (step S306). At this time, the associated NMOS transistor 144 is also turned to an electrically-conductive state.

Then, it is determined whether or not "1" is present in the write data (data stored in the cell corresponding to the sector write address N) transferred to the write circuit 112 (step S307). If it is determined as "YES," the write circuit 112 is set to apply the second positive pulse to the cell (cell in the memory cell array 218) to which "1" is to be switched (step S308). That is, the write circuit 112 is set so that +5V is applied to the voltage application circuit 140 side of the memory cell and 0V is applied to the voltage application circuit 142 side of the memory cell, and voltages are applied (step S309). Then, the write circuit 112 is set to apply the first negative pulse to the cell (step S310). To be specific, the write circuit 112 is set so that −2V is applied to the voltage application circuit 140 side of the memory cell and 0V is applied to the voltage application circuit 142 side of the memory cell, and voltages are applied (step S311).

The second positive pulse is a write switching pulse. The first negative pulse is a bipolar high-resistance state attaining pulse (first electric pulse). By applying these two pulses sequentially, the element is switched from the unipolar high-resistance state to the bipolar high-resistance state.

If it is determined as NO in step S307, the process returns to step S301.

When step S310 is complete, one is added to N (step S312). It is determined whether or not N is larger than Nmax (step S313). If it is determined that N is not larger than Nmax, the process returns to step 304. With this operation, the switching operation is performed sequentially for the sector write addresses N=1, 2, . . . , Nmax. When N is larger than Nmax, the switching operation for the associated sector is complete. Therefore, "0" is written to the temporary write flag region corresponding to the sector for resetting (step S314), and the process returns to step S301. The write operation for the temporary write flag region 116 is similar to the write operation for the cell in the memory cell array 218, and will not be described repetitively.

The nonvolatile memory apparatus 100 repeats the operation from step S301 to step S313 to perform the switching operation sequentially until "1" is written to the flags corresponding to all of the sectors.

With the above described operation and configuration, the nonvolatile memory apparatus 100 according to this embodiment performs the read operation and the write operation for a desired memory cell 139 according to the chip select CS, the external control signal CTL, the address AD, and the write pulse WP so that a high-speed write operation can be attained by the first write operation with a short pulse (120 ns) and data retention characteristic can be improved by writing the data reliably by the second write operation.

Embodiment 2

Figure 10:
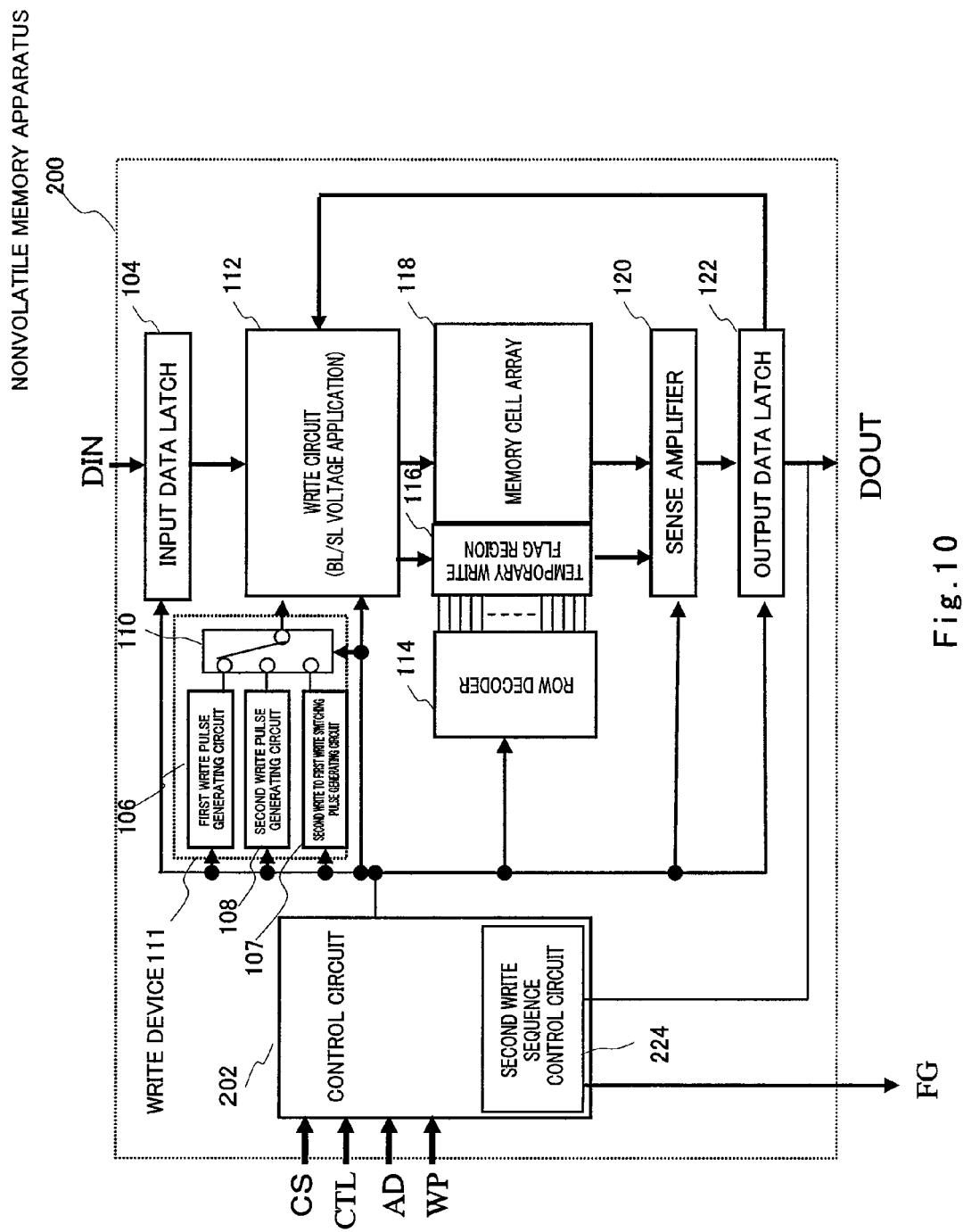
[FIG. 10]

FIG. 10 is a block diagram showing a schematic configuration of a nonvolatile memory apparatus according to Embodiment 2 of the present invention. Hereinafter, the schematic configuration and operation of the nonvolatile memory apparatus of this embodiment will be described with reference to FIG. 10. The nonvolatile memory apparatus of Embodiment 2 is configured such that a second write sequence control circuit 224 is added to the control circuit of the nonvolatile memory apparatus of Embodiment 1 to output to a controller a flag FG indicating whether or not the second write is being performed. The other configuration and operation are similar to those of Embodiment 1. Therefore, the constituents common to Embodiment 1 and Embodiment 2 are identified by the same reference numerals and names will not be described repetitively.

A second write sequence control circuit 224 is a circuit serving to control the second write operation. The second write sequence control circuit 224 implements within the nonvolatile memory apparatus the control for the second write operation executed by the controller 180 in Embodiment 1.

The flag FG indicating whether or not the second write is being performed is a binary signal output to the controller (not shown, corresponding to the controller 180 of Embodiment 1) located outside the control circuit 202, based on whether or not the second write is being performed. When the flag FG indicating whether or not the second write is being performed indicates "1," this means that the nonvolatile memory apparatus 200 is performing the second write and is unable to receive data from outside. When the flag FG indicating whether or not the second write is being performed indicates "0," this means that the nonvolatile memory apparatus 200 is not performing the second write and is able to receive data from outside (perform first write).

In this embodiment, the nonvolatile memory apparatus can also be incorporated into the nonvolatile data storage medium including the controller, as shown in FIG. 2.

The nonvolatile memory apparatus 200 according to this embodiment is able to achieve the advantage similar to that of the nonvolatile memory apparatus 100 of Embodiment 1 and in addition, need not control the second write operation using the external controller. This improves user convenience. In addition, while "1" is output as the flag FG indicating whether or not the second write is being performed, the controller and system located outside do not output data write command, enabling prevention of an incorrect operation.

Embodiment 3

Figure 11:
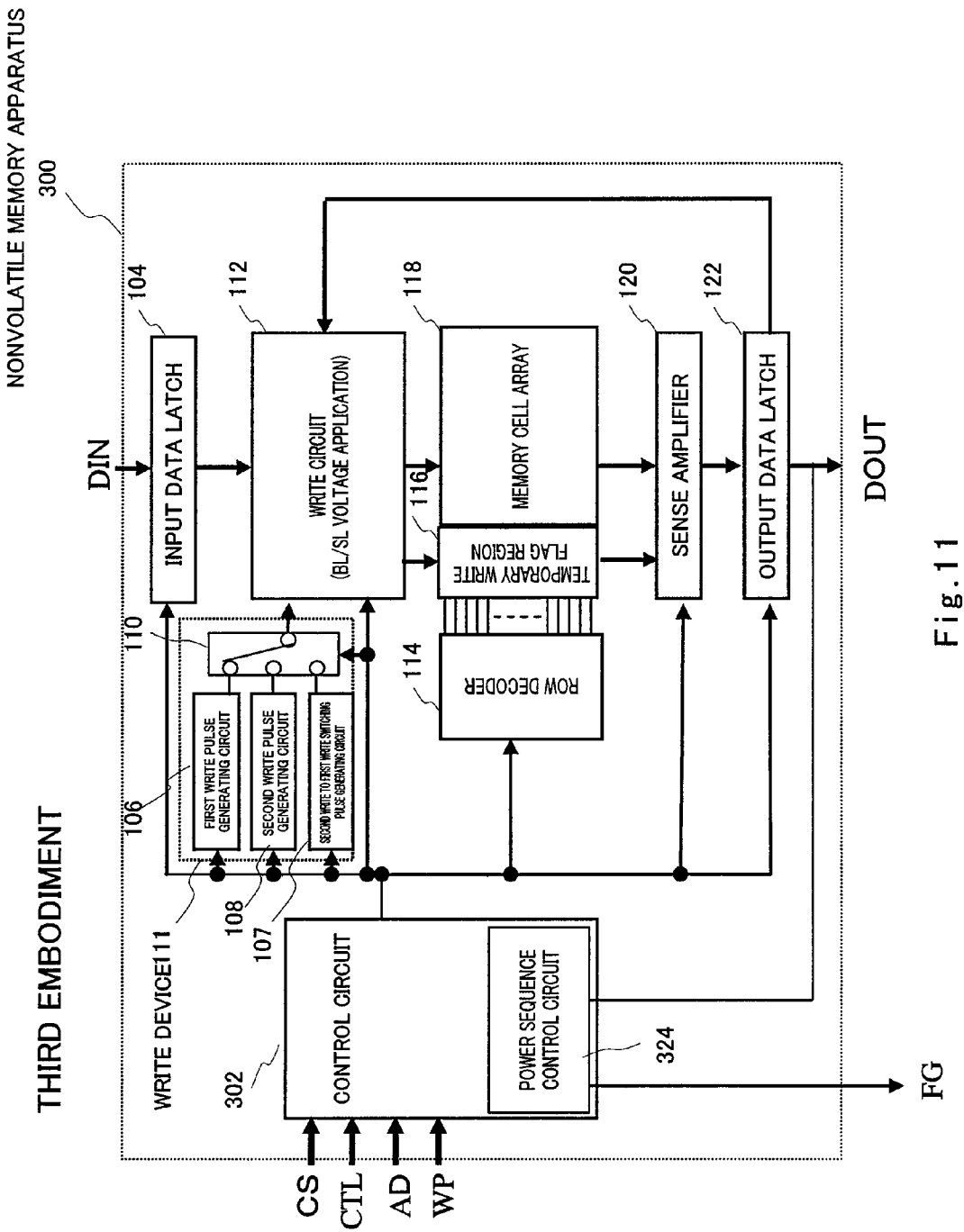
[FIG. 11]
Figure 12:
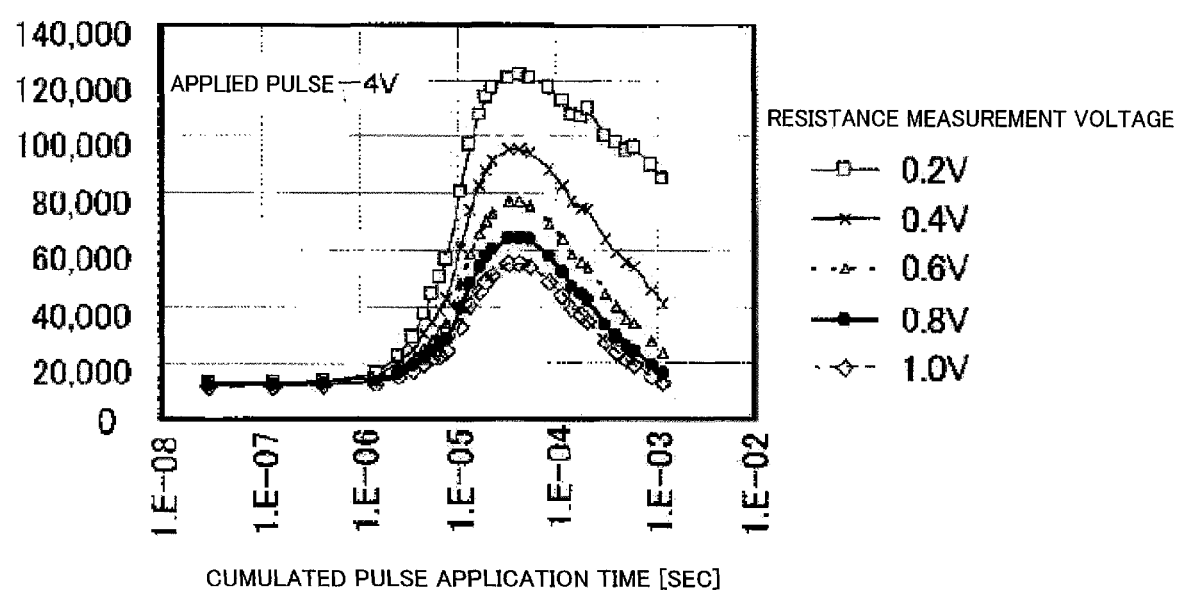
[FIG. 12]
Figure 13:
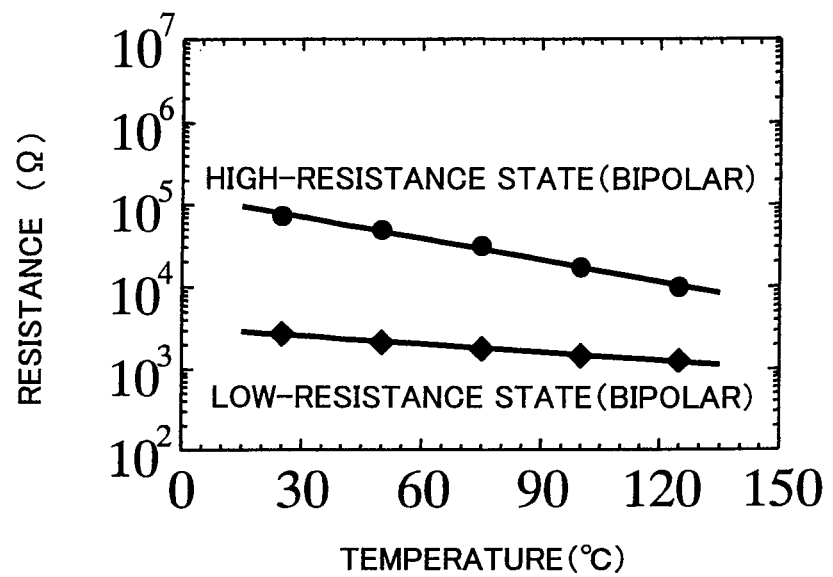
[FIG. 13]
Figure 13:
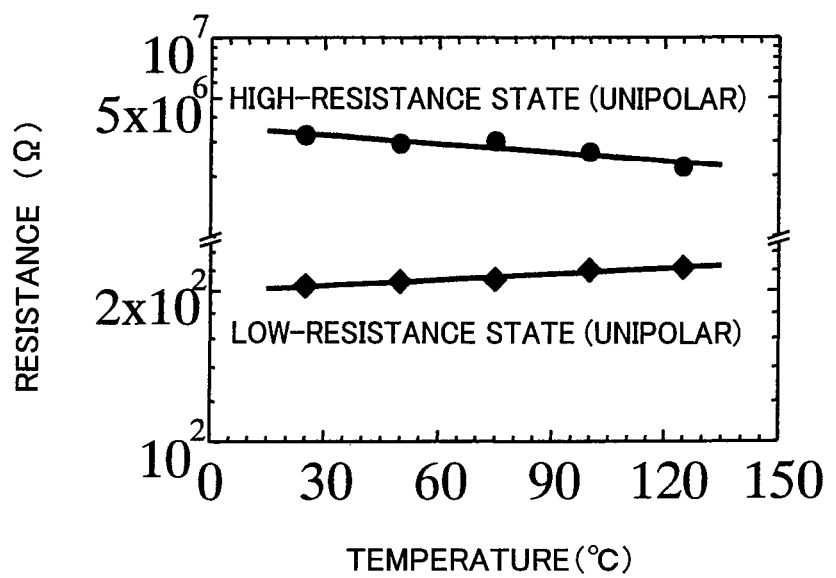

FIG. 11 is a block diagram showing a schematic configuration of a nonvolatile memory apparatus according to Embodiment 3 of the present invention. Hereinafter, the schematic configuration and operation of the nonvolatile memory apparatus of this embodiment will be described with reference to FIG. 11. The nonvolatile memory apparatus of Embodiment 3 is configured such that the second write sequence control circuit of the nonvolatile memory apparatus of Embodiment 2 is replaced by a power sequence control circuit. The other configuration is similar to that of Embodiment 2. Therefore, the constituents common to Embodiment 2 and Embodiment 3 are identified by the same reference numerals and names and will not be described repetitively.

The power sequence control circuit 324 is a circuit incorporated into he control circuit 302, and configured to operate a POWER-DOWN SEQUENCE and to perform the second write operation when the electric power supply of the nonvolatile memory apparatus 300 is performing a TURN-OFF operation. Also, the power sequence control circuit 324 is a circuit configured to operate a POWER-ON SEQUENCE and to perform the operation for switching from the second write to the first write when the electric power supply of the nonvolatile memory apparatus 300 is performing a TURN-ON operation.

The nonvolatile memory apparatus 300 is driven by an electric power supplied from outside. Therefore, the TURN-OFF operation of the electric power supply of the nonvolatile memory apparatus 300 is started in accordance with a control signal from outside instead of automatically. To be specific, the TURN-OFF operation of the electric power supply is carried out by the following steps.

Initially, when the electric power supply of the system (corresponding to system 190 of FIG. 2) performs the TURN-OFF operation, the system sends a signal for notifying the TURN-OFF operation of the electric power supply to the controller (corresponding to the controller 180 of FIG. 2). Receiving the signal for notifying the TURN-OFF operation of the electric power supply, the controller sends an electric power supply TURN-OFF signal, to the nonvolatile memory apparatus 300. Receiving the electric power supply TURN-OFF signal, the power sequence control circuit 324 executes the POWER-DOWN SEQUENCE, and the second write is performed in the operation. The second write operation in the POWER-DOWN SEQUENCE is similar to the second write operation in Embodiment 1, and will not be described repetitively.

When the switch of the system (corresponding to the system 190 of FIG. 2) is turned ON and the TURN-ON operation of the electric power supply is started, the electric power starts to be supplied from the system to the controller (corresponding to the controller 180 of FIG. 2) and to the nonvolatile memory apparatus 300. The power sequence control circuit 324 detects that the electric power supply starts to be supplied, and executes the POWER-ON SEQUENCE, so that the operation for switching from second write to first write is performed. The operation for switching from second write to first write in the POWER-ON SEQUENCE is similar to the additional write operation in Embodiment 1, and will not be described repetitively.

In the manner as described above, in this embodiment, data is written by the second write all at once when the electric power supply is performing the TURN-OFF operation. Therefore, when the electric power supply is OFF, the second write for all the memory cells containing data is complete. As a result, the data can be surely preserved during an OFF-state of the electric power supply. On the other hand, when the electric power supply is ON, all the memory cells containing data are in the first write mode, and the second write operation and the operation for switching from second write to first write are not performed during an ON-state of the electric power supply (during a normal operation), so that writing of all data is performed by the first write. This increases an apparent write speed. That is, since the second write operation and the operation for switching from second write to first write are not performed during the normal operation, it is possible to achieve a great advantage that the second write operation and the operation for switching from second write to first write do not substantially affect overall system performance.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A nonvolatile memory apparatus of the present invention can attain a nonvolatile memory apparatus which is capable of operating at a high-speed and has high reliability, and is useful in fields of a variety of electronic hardware in which the nonvolatile memory apparatus is mounted.

The invention claimed is:

1. A nonvolatile memory apparatus including nonvolatile memory elements each of which has a bipolar state and a unipolar state and changes resistance in response to electric pulses applied, comprising:
a write pulse generation circuit for sequentially applying two electric pulses which are identical in polarity to a nonvolatile memory element in a bipolar high-resistance state to switch the nonvolatile memory element in the bipolar high-resistance state to a unipolar high-resistance state; and
a write switching circuit for applying a write switching pulse which is opposite in polarity to the two electric pulses to the nonvolatile element in the unipolar high-resistance state to switch the nonvolatile memory element in the unipolar high-resistance state to a bipolar low-resistance state.

2. A nonvolatile memory apparatus including nonvolatile memory elements each of which changes its resistance in response to electric pulses applied, comprising:
a first write circuit for performing first write in which a first electric pulse is applied to the nonvolatile memory element to switch a resistance value of the nonvolatile memory element from a first resistance value to a second resistance value and a second electric pulse which is opposite in polarity to the first electric pulse is applied to the nonvolatile memory element to switch the resistance value of the nonvolatile memory element from the second resistance value to the first resistance value;
a second write circuit for performing second write in which a third electric pulse is applied to the nonvolatile memory element to switch the resistance value of the nonvolatile memory element from a third resistance value to a fourth resistance value and a fourth electric pulse which is identical in polarity to the third electric pulse is applied to the nonvolatile memory element to switch the resistance value of the nonvolatile memory element from the fourth resistance value to a fifth resistance value;
a write switching circuit for generating a write switching pulse to switch the resistance value of the nonvolatile memory element from the fifth resistance value to the first resistance value; and
a controller configured to execute control to select the first write circuit, the second write circuit, or the write switching circuit; wherein
the nonvolatile memory apparatus is configured to perform the first write or the second write to the nonvolatile memory element using the circuit selected by the controller.

3. The nonvolatile memory apparatus according to claim 2, wherein the write switching circuit is configured to apply a fifth electric pulse which is opposite in polarity to the fourth electric pulse before the first write circuit writes data and then the first write circuit writes data.

4. The nonvolatile memory apparatus according to claim 2, wherein the first electric pulse is identical in polarity to the third electric pulse.

5. The nonvolatile memory apparatus according to claim 2, wherein the first electric pulse is an electric pulse having a voltage equal to a voltage of the fourth electric pulse.

6. The nonvolatile memory apparatus according to any one of claims 2 to 5, wherein the first electric pulse has a pulse width equal to a pulse width of the fourth electric pulse.

7. The nonvolatile memory apparatus according to any one of claims 2 to 6, wherein the third electric pulse has a voltage which is larger in absolute value than a voltage of the fourth electric pulse.

8. The nonvolatile memory apparatus according to any one of claims 2 to 7, wherein the third electric pulse has a pulse width which is not smaller than a pulse width of the fourth electric pulse.

9. The nonvolatile memory apparatus according to any one of claims 2 to 8, wherein the third resistance value is equal to the second resistance value.

10. The nonvolatile memory apparatus according to claim 2, wherein the first resistance value is a first low-resistance value, and the second resistance value is a first high-resistance value having a resistance value higher than a resistance value of the first low-resistance value;
wherein the third resistance value is a first high-resistance value, and the fourth resistance value is a second low-resistance value having a resistance value lower than a resistance value of the first low-resistance value; and
wherein the fifth resistance value is a second high-resistance value having a resistance value higher than a resistance value of the first high-resistance value.

11. A nonvolatile memory apparatus,
wherein the controller includes a first controller and a second controller;
wherein the first controller is configured to read data from a nonvolatile memory element to which the first write circuit has written data, and to cause the second write circuit to write data when detecting the first resistance value; and
wherein the second controller is configured to read data from a nonvolatile memory element to which the second write circuit has written data, and causes the first write circuit to write data when detecting the third resistance value.

12. The nonvolatile memory apparatus according to claim 2, wherein the write switching circuit is configured to apply a fifth electric pulse which is opposite in polarity to the fourth electric pulse before the first write circuit writes data and then the first write circuit writes data.

13. The nonvolatile memory apparatus according to claim 2, further comprising:
a memory cell array including plural memory cell sections each including plural memory cells respectively having the nonvolatile memory elements; and
a temporary write flag region including flag nonvolatile memory elements respectively provided for the memory cell sections such that one flag nonvolatile memory element corresponds to one memory cell section, wherein in the temporary write flag region, a first write state is written to a flag nonvolatile memory element so as to correspond to the first write performed by the first write circuit to a nonvolatile memory element belonging to a memory cell section, and a second write state is written to a flag nonvolatile memory element so as to correspond to the second write performed by the second write circuit to a nonvolatile memory element belonging to a memory cell section.

14. A nonvolatile data storage medium comprising:
the nonvolatile memory apparatus according to claim 13; and
a fourth controller;
wherein the fourth controller is configured to, based on a value of the temporary write flag region, determine whether or not each of the memory cell sections is a write target memory cell section to which the second write circuit writes data, the write target memory cell section including a nonvolatile memory element to which the second write circuit has not completed writing the data; and
wherein the fourth controller is configured to cause the second write circuit to write data to a nonvolatile memory element belonging to the write target memory cell section to which the second write circuit writes data.

15. The nonvolatile memory apparatus according to claim 2, further comprising:
a switching sequence control circuit configured to control the write switching circuit so as to switch between the first write circuit and the second write circuit; wherein
the switching sequence control circuit is configured to control the write switching circuit to cause the second write circuit to write data when a control signal input from an external device indicates that the nonvolatile memory apparatus is not selected.

16. A nonvolatile data storage medium comprising:
the nonvolatile memory apparatus according to claim 15; and
a fifth controller;
wherein the fifth controller is the external device.

17. The nonvolatile data storage medium according to claim 16,
wherein the fifth controller is configured to control the write switching circuit to cause the second write circuit to write data when an electric power supply is performing a TURN-OFF operation.

18. The nonvolatile data storage media according to claim 16,
wherein the fifth controller is configured to control the write switching circuit to cause the first write circuit to write data when an electric power supply is performing a TURN-ON operation.

19. The nonvolatile memory apparatus according to claim 2, being configured to output a flag signal indicating that the second write is being performed to inhibit that an external device inputs write data to the nonvolatile memory apparatus, when the second write circuit is writing data.

20. A method for driving a nonvolatile memory apparatus including nonvolatile memory elements each of which has a bipolar state and a unipolar state and changes resistance in response to electric pulses applied, the method comprising:
a second write step for performing second write in which two electric pulses which are identical in polarity are sequentially applied to a nonvolatile memory element in a bipolar high-resistance state to switch the nonvolatile memory element in the bipolar high-resistance state to a unipolar high-resistance state; and
a write switching step for performing write switching in which a write switching pulse which is opposite in polarity to the two electric pulses is applied to the nonvolatile element in the unipolar high-resistance state to switch the nonvolatile memory element in the unipolar high-resistance state to a bipolar low-resistance state.

* * * * *

UNITED STATES PATENT AND TRADEMARK OFFICE
CERTIFICATE OF CORRECTION

| | |
|---|---|
| PATENT NO. | : 8,094,482 B2 |
| APPLICATION NO. | : 12/529466 |
| DATED | : January 10, 2012 |
| INVENTOR(S) | : Zhiqiang Wei et al. |

It is certified that error appears in the above-identified patent and that said Letters Patent is hereby corrected as shown below:

Specifically, in column 26, line 38, it reads "A nonvolatile memory apparatus" but should read -- The nonvolatile memory apparatus according to Claim 2 --

And, in column 28, line 24, it reads "a second write step for performing second write in which" but should read -- a write pulse generating step for performing write in which --

Signed and Sealed this
Twenty-sixth Day of June, 2012

David J. Kappos
*Director of the United States Patent and Trademark Office*